United States Patent
Moriya et al.

(10) Patent No.: US 6,804,323 B2
(45) Date of Patent: Oct. 12, 2004

(54) MASK PATTERN MAGNIFICATION CORRECTION METHOD, MAGNIFICATION CORRECTION APPARATUS, AND MASK STRUCTURE

(75) Inventors: Akira Moriya, Kanagawa (JP); Takeshi Miyachi, Tochigi (JP); Shinichi Hara, Kanagawa (JP); Toshinobu Tokita, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/176,614

(22) Filed: Jun. 24, 2002

(65) Prior Publication Data

US 2003/0023339 A1 Jan. 30, 2003

(30) Foreign Application Priority Data

Jun. 25, 2001 (JP) ........................... 2001/190809

(51) Int. Cl.⁷ ................................ G21K 5/00
(52) U.S. Cl. ............................ 378/35; 378/34
(58) Field of Search ..................... 378/34, 35

(56) References Cited

U.S. PATENT DOCUMENTS

| | | | |
|---|---|---|---|
| 5,356,686 A | 10/1994 | Fujioka et al. | 428/65 |
| 5,485,495 A | 1/1996 | Miyachi et al. | 378/34 |
| 5,544,213 A | 8/1996 | Chiba et al. | 378/34 |
| 5,825,463 A | 10/1998 | Hara et al. | 355/75 |
| 5,854,819 A | 12/1998 | Hara et al. | 378/34 |
| 6,069,931 A * | 5/2000 | Miyachi et al. | 378/34 |
| 6,258,492 B1 | 7/2001 | Miyachi | 430/5 |
| 6,381,005 B1 | 4/2002 | Kasumi et al. | 355/75 |
| 6,453,001 B2 * | 9/2002 | Watanabe et al. | 378/34 |

FOREIGN PATENT DOCUMENTS

| | | |
|---|---|---|
| EP | 0 822 473 A2 | 2/1998 |
| JP | 9-211872 | 8/1997 |
| JP | 10-242033 | 9/1998 |
| JP | 10-312956 | 11/1998 |
| JP | 2000-137319 | 5/2000 |

* cited by examiner

*Primary Examiner*—Craig E. Church
(74) *Attorney, Agent, or Firm*—Fitzpatrick, Cella, Harper & Scinto

(57) ABSTRACT

A method of correcting a magnification of a mask pattern formed on a mask substrate. The method includes applying forces to four pressurizing points of an outer periphery of an approximately ring-shaped frame, which supports the mask substrate and has a rectangular window, on substantially extended lines of two diagonal lines of the rectangular window, and adjusting at least an angle, to the extended lines, of a vector of the forces applied to each of the pressurizing points.

20 Claims, 20 Drawing Sheets

SEMICONDUCTOR DEVICE MANUFACTURING FLOW

MASK PATTERN MAGNIFICATION CORRECTION METHOD, MAGNIFICATION CORRECTION APPARATUS, AND MASK STRUCTURE

FIELD OF THE INVENTION

The present invention relates to a mask structure used to manufacture a semiconductor device and a correction technique for the mask pattern. The present invention also relates to an exposure apparatus and a device manufacturing method using the correction technique. The present invention also relates to a mask pattern manufacturing method using the correction technique.

BACKGROUND OF THE INVENTION

Lithography technologies using X-rays are attracting attention as techniques of forming especially fine patterns in semiconductor devices. In one of the schemes, a mask and wafer are closely arranged and irradiated with X-rays to realize one-to-one exposure/transfer. In this scheme, since the mask and wafer are closely arranged, and no reduction projecting optical system is present, the transfer magnification on the wafer cannot be adjusted.

To solve this problem, a (magnification correction) method of applying an external force to a mask structure to change the pattern size has been proposed, as disclosed in Japanese Patent Laid-Open No. 10-242033.

In this prior art, two abutting fixed members 258 and 259 are arranged in the directions of extended lines of two diagonal lines of the rectangular window of a mask structure, respectively, as shown in FIG. 15. Forces P1 and P2 toward the mask center are applied to positions opposite to the abutting fixed members, thereby correcting the magnification.

In the above prior art, an isotropic change in pattern can be obtained in the X- and Y-directions (square reducing modification). However, the magnification cannot be corrected by desired different amounts in the X- and Y-axis directions (rectangular reducing modification).

SUMMARY OF THE INVENTION

It is the first object of the present invention to provide a mask pattern magnification correction method which improves the prior art and makes it possible to correct a magnification by different amounts in the X- and Y-axis directions, thereby realizing more accurate overlay.

It is the second object of the present invention to provide a method of realizing the first object by a simpler mechanism or pressurizing method.

It is the third object of the present invention to provide a device manufacturing method which includes the step of transferring a mask pattern onto a wafer serving as a photosensitive substrate and can cope with mask pattern correction by different magnifications in the X- and Y-axis directions.

It is the fourth object of the present invention to provide a mask pattern manufacturing method of drawing a mask pattern while a membrane is being distorted by a predetermined force using a mask pattern magnification correction method according to the present invention.

It is the fifth object of the present invention to provide a mask structure to which a mask pattern magnification correction method according to the present invention is applied.

In order to solve the problem and achieve the objects, the first aspect of the present invention is characterized in that, for a mask structure which has a mask substrate on which a mask pattern is formed and a ring-shaped support frame having a rectangular window, forces are applied to four pressurizing points of an outer periphery of the support frame on substantially extended lines of two diagonal lines of the rectangular window, and an angle of a vector of each force is adjusted with respect to each of the pressurizing points.

In order to achieve the above objects, according to the second aspect of the present invention, the vector of the force is decomposed in the X- and Y-axis directions parallel to the sides of the rectangular window to pressurize the support frame, the force is applied to the support frame through a rolling contactable portion, some of the pressurizing points are set as fixed points, or for at least some of the fixed points, and a slide function is added to a receiving mechanism that receives the fixed point, thereby making the mechanism or pressurizing method more simple and easy to handle.

In order to achieve the above objects, the third aspect of the present invention is characterized in that the mask pattern magnification correction method of the present invention is used for a device manufacturing method comprising the mask pattern transfer step of transferring a mask pattern onto a photosensitive substrate in X-ray exposure or the like.

In order to achieve the above objects, the fourth aspect of the present invention is characterized in that the mask pattern magnification correction method of the present invention is used for a mask pattern manufacturing method in which a mask pattern is drawn using an electron beam or the like.

In order to achieve the above objects, a mask structure according to the fifth aspect of the present invention is characterized by comprising a mask substrate having a membrane on which a mask pattern is formed, and a support frame having a rectangular window, wherein the outer shape of the support frame has W-shaped grooves, V-shaped grooves, or chamfered portions in correspondence with the mask pattern magnification correction method of the present invention.

In order to achieve the above objects, the sixth aspect of the present invention is characterized by comprising a pressurizing mechanism which applies, for a mask structure which has a mask substrate on which a mask pattern is formed and a ring-shaped support frame having a rectangular window, forces to four pressurizing points of an outer periphery of the support frame on substantially extended lines of two diagonal lines of the rectangular window, wherein an angle of a vector of each force based on the pressurizing mechanism can be changed with respect to each of the pressurizing points.

In the mask pattern magnification correction apparatus according to the present invention, for at least some of the pressurizing points, pressurizing points may be set for pressurizing in two directions perpendicular to each other, and for at least some of the vectors of the forces, the force may be decomposed in X- and Y-axis directions parallel to sides of the rectangular window and applied to the support frame. The force is preferably applied to the support frame through a rolling contactable portion. Some of the pressurizing points are preferably set as fixed points. For at least some of the fixed points, a slide function is preferably added to a receiving mechanism that receives the fixed point.

The present invention can also be applied to an exposure apparatus which transfers a mask pattern onto a photosensitive substrate on the basis of a mask pattern manufactured using any one of the above mask pattern magnification correction methods or mask pattern magnification correction apparatuses.

The present invention can also be applied to a semiconductor device manufacturing method comprising the steps of installing, in a semiconductor factory, manufacturing apparatuses for performing various processes, including the exposure apparatus, and manufacturing a semiconductor device using the manufacturing apparatuses by performing a plurality of processes. The method preferably further comprises the steps of connecting the manufacturing apparatuses through a local area network, and exchanging information related to at least one of the manufacturing apparatuses between the local area network and an external network outside the semiconductor manufacturing factory by data communication. Preferably, maintenance information of the manufacturing apparatus is obtained by accessing, through an external network, a database provided by a vendor or user of the exposure apparatus by data communication, or production management is done by data communication with a semiconductor manufacturing factory different from the semiconductor manufacturing factory through the external network.

The present invention can also be applied to a semiconductor manufacturing factory comprising manufacturing apparatuses for performing various processes, including the exposure apparatus, a local area network which connects the manufacturing apparatuses, and a gateway which allows the local area network to access an external network outside the factory, wherein information related to at least one of the manufacturing apparatuses is exchanged by data communication.

The present invention can also be applied to a maintenance method for the exposure apparatus installed in a semiconductor manufacturing factory, comprising the steps of causing a vendor or user of the exposure apparatus to provide a maintenance database connected to an external network outside the semiconductor manufacturing factory, permitting access from the semiconductor manufacturing factory to the maintenance database through the external network, and transmitting maintenance information accumulated in the database to the semiconductor manufacturing factory side through the external network.

In the present invention, the exposure apparatus may be characterized by further comprising a display, a network interface, and a computer which executes network software, wherein maintenance information of the exposure apparatus is exchanged through a computer network by data communication. The network software preferably provides, on the display, a user interface connected to an external network outside a factory in which the exposure apparatus is installed to access a maintenance database provided by a vendor or user of the exposure apparatus and allows obtaining information from the database through the external network.

As described above, as the first effect of the present invention, mask pattern correction by different magnifications in the X- and Y-axis directions can also be realized.

As the second effect of the present invention, mask pattern magnification correction can be performed by a mechanism or pressurizing method that is more simple and easy to handle. Hence, the apparatus can be made compact, and the controllability and operability can be improved. In addition, for example, when some pressurizing points are set as fixed points, the apparatus can be made compact because the number of complex pressurizing mechanisms can be decreased. Furthermore, the position of the mask pattern from the fixed points can easily be obtained, resulting in advantage in positioning control.

As the third effect of the present invention, an apparatus and a device manufacturing method, which can accurately correct the mask pattern transfer magnification, can be provided. Hence, devices that are more precise than before can be produced at high yield.

As the fourth effect of the present invention, an apparatus or method, which can correct the magnification in mask pattern drawing, can be provided.

As the fifth effect of the present invention, a mask structure to be subjected to the mask pattern magnification correction method of the present invention can be provided.

Other objects and advantages besides those discussed above shall be apparent to those skilled in the art from the description of a preferred embodiment of the invention which follows. In the description, reference is made to the accompanying drawings, which form a part thereof and which illustrate an example of the invention. Such an example, however, is not exhaustive of the various embodiments of the invention, and, therefore, reference is made to the claims which follow the description for determining the scope of the invention.

DETAILED DESCRIPTION OF THE PREFERRED EMBODIMENTS

Figure 1:
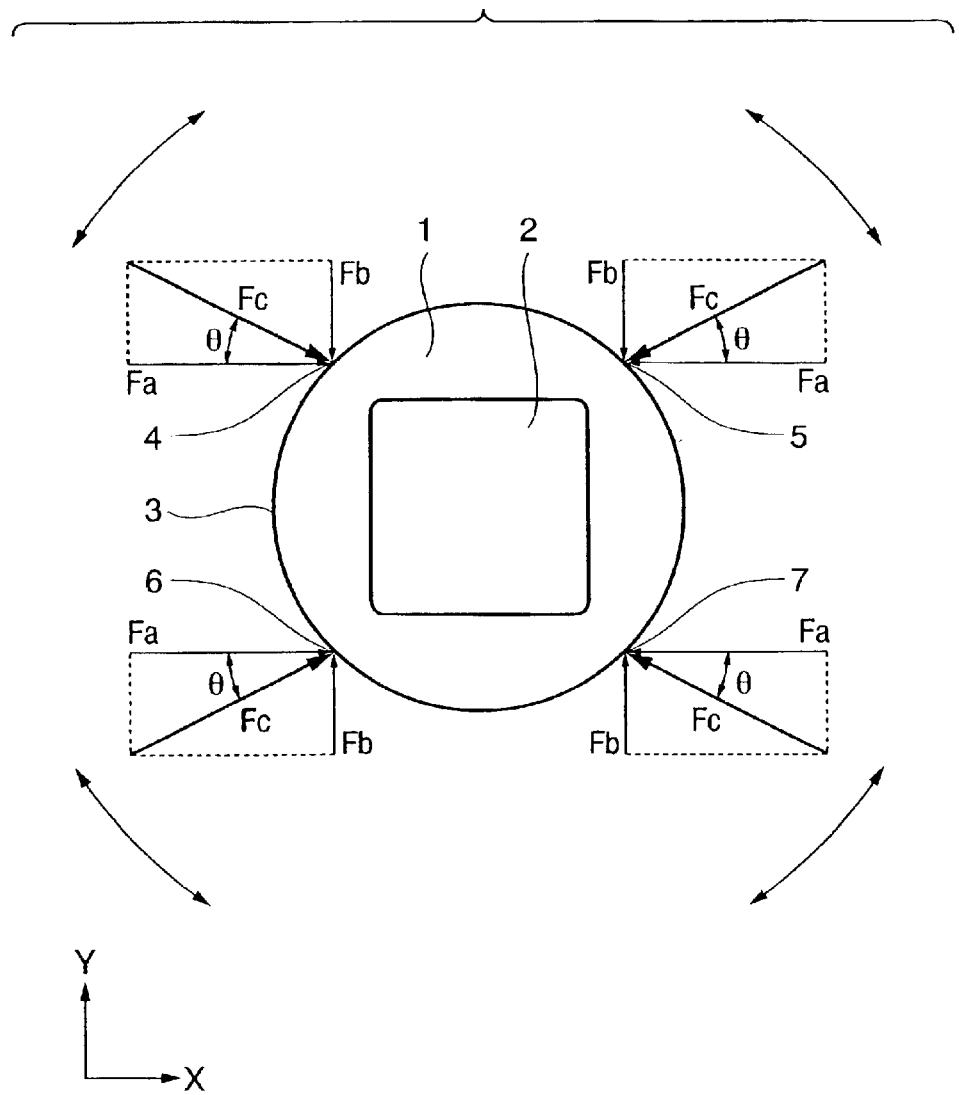
FIG. 1 is a plan view showing the rectangular window of a mask structure and force vectors in a mask pattern magnification correction method according to the present invention.

FIG. 1 is a plan view for explaining the positional relationship between a rectangular window 2 and vectors of forces (magnitudes and directions of forces) to be applied to a support frame 1 of a mask structure in executing a mask pattern magnification correction method of the present invention. The X- and Y-axes are defined in parallel to corresponding sides with respect to the rectangular window 2, as shown in FIG. 1. This mask pattern magnification correction method is executed by defining pressurizing points 4 to 7 on an outer periphery 3 of the support frame 1 on the extended lines of the two diagonal lines of the rectangular window 2 and applying a force Fc to each pressurizing point. The force Fc is a resultant force of a force Fa in the X-axis direction and a force Fb in the Y-axis direction.

To obtain a desired corrected magnification $-\alpha$ ppm in the X-axis direction and a corrected magnification $-\beta$ ppm in the Y-axis direction, the magnitudes (scalar amounts) of the forces Fa and Fb are determined.

Each pressurizing mechanism for applying the force Fc can change its angle with respect to a corresponding one of the four pressurizing points 4 to 7, as indicated by arrows. In the method according to this embodiment, the force Fc which has a magnitude and direction represented by an angle $\theta$, i.e., the force Fc corresponding to the resultant force of the force Fa in the X-axis direction and the force Fb in the Y-axis direction, which are set to obtain the desired corrected magnifications in the X- and Y-axis directions, is applied.

The relationships between the forces Fa, Fb, and Fc in FIG. 1 are represented as follows.

$Fa \perp Fb$

Figure 2:
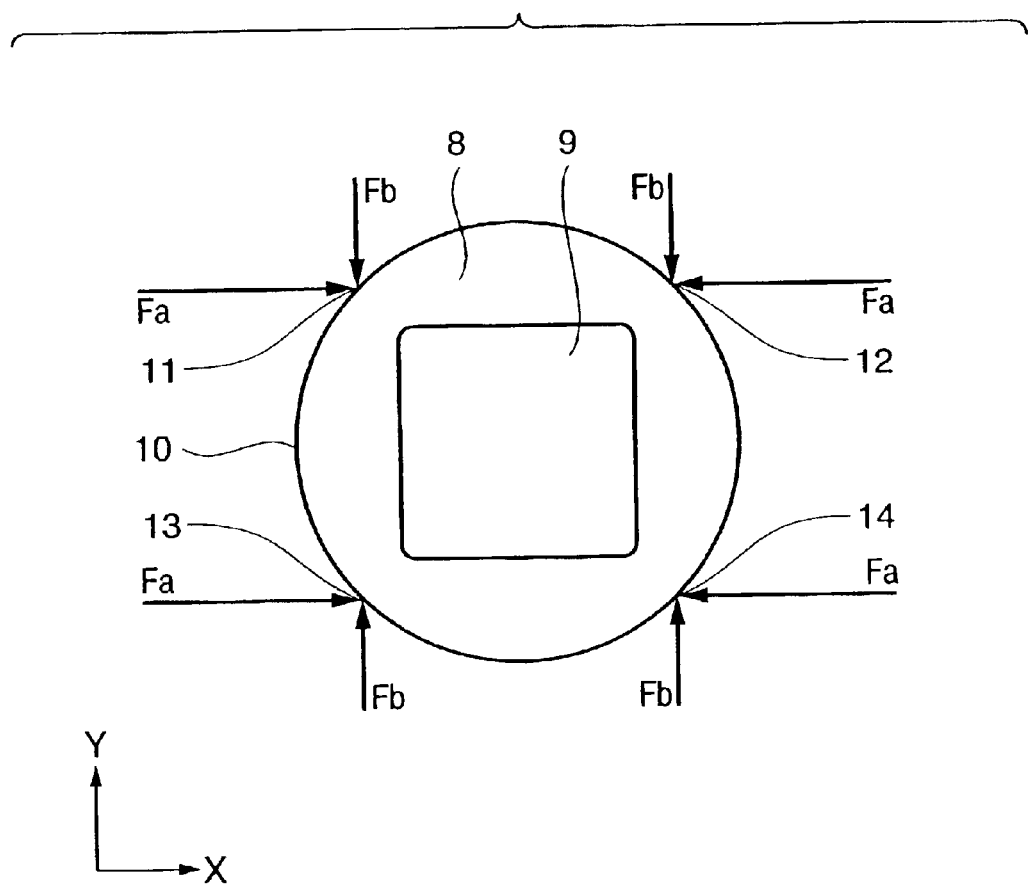
FIG. 2 is a plan view showing a method of applying a force Fc to be applied to the support frame of the mask structure in the mask pattern magnification correction method shown in FIG. 1 by decomposing the force into a force Fa in the X-axis direction and a force Fb in the Y-axis direction and applying the forces to a support frame 8.

The magnitude (scalar amount) of the force Fc is given by $Fc = \sqrt{Fa^2 + Fb^2}$ The angle $\theta$ made by the force Fc and the X-axis is given by $\theta = \tan^{-1} Fb/Fa$ FIG. 2 is a plan view showing a method of applying the force Fc to be applied to the support frame 1 of the mask structure in the mask pattern magnification correction method shown in FIG. 1 by decomposing the force into the force Fa in the X-axis direction and the force Fb in the Y-axis direction, which are parallel to the sides of a rectangular window 9, and applying the forces to the support frame 8.

The X- and Y-axes are defined in parallel to corresponding sides with respect to the rectangular window 9, as shown in FIG. 2. Pressurizing points 11 to 14 are defined on an outer periphery 10 of the support frame 8 on the extended lines of the two diagonal lines of the rectangular window 9. The forces Fa and Fb are applied to each pressurizing point.

Figure 3:
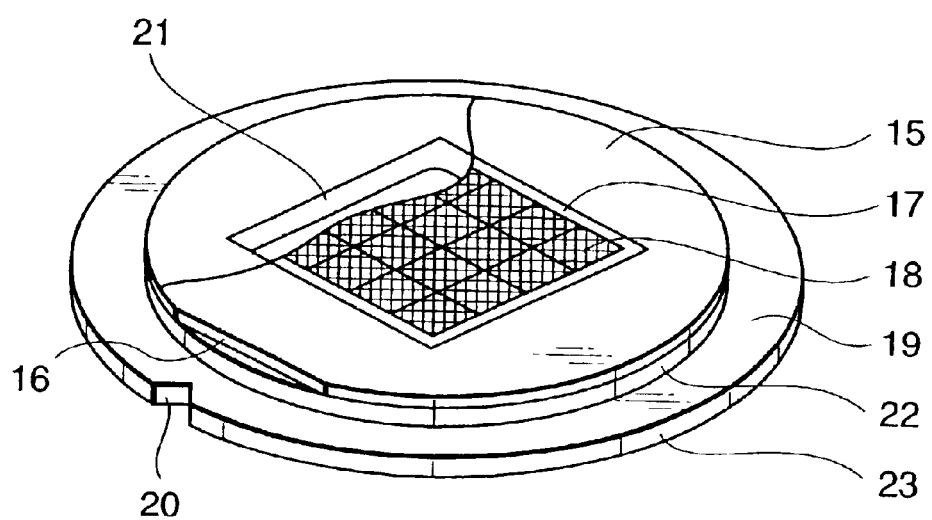
FIG. 3 is a partially cutaway perspective view showing a mask structure.

FIG. 3 is a partially cutaway perspective view showing a transmission mask structure used for lithography using X-rays.

Reference numeral 15 denotes a circular mask substrate formed from a silicon wafer. The mask substrate 15 has a notch called an orientation flat 16 that defines the direction of the substrate and a rectangular window 17 serving as a radiation beam transmission region. The mask substrate 15 may have a V-shaped groove or the like in place of the orientation flat 16 to define the direction of the mask substrate 15.

For the mask substrate 15, an SiN film or SiC film is formed on the surface of a silicon substrate. After that, a prospective rectangular window portion is removed by back etching from one side of the silicon substrate to leave the SiN film or SiC film as a very thin membrane. A mask pattern 18 to be transferred is formed on the membrane using a radiation absorber (a metal such as W or Ta).

In the mask pattern magnification correction method according to the embodiment of the present invention, a mask pattern is reduced and corrected. Hence, the mask pattern 18 is formed in advance at a magnification slightly larger than an ideal transfer pattern size. This offset magnification is determined also in consideration of a process distortion supposed in a wafer process after transfer.

Reference numeral 19 denotes a ring-shaped support frame 19 which supports and reinforces the mask substrate 15. The support frame 19 is preferably formed from heat-resistant glass or a ceramic such as SiC. The mask substrate 15 and support frame 19 are joined by adhesive bonding or anodic bonding.

The support frame 19 has a V-shaped groove called a notch portion 20 that defines the direction and a rectangular window 21 serving as a radiation beam transmission region. The outer shape of the support frame 19 is based on two, upper and lower disks, i.e., a circular upper portion 22 an circular lower portion 23. As will be described later, a W-shaped groove or V-shaped groove may be formed or pressurizing points may be chamfered to make the outer shape rectangular in correspondence with the mask pattern magnification correction method of the present invention.

Figure 4:
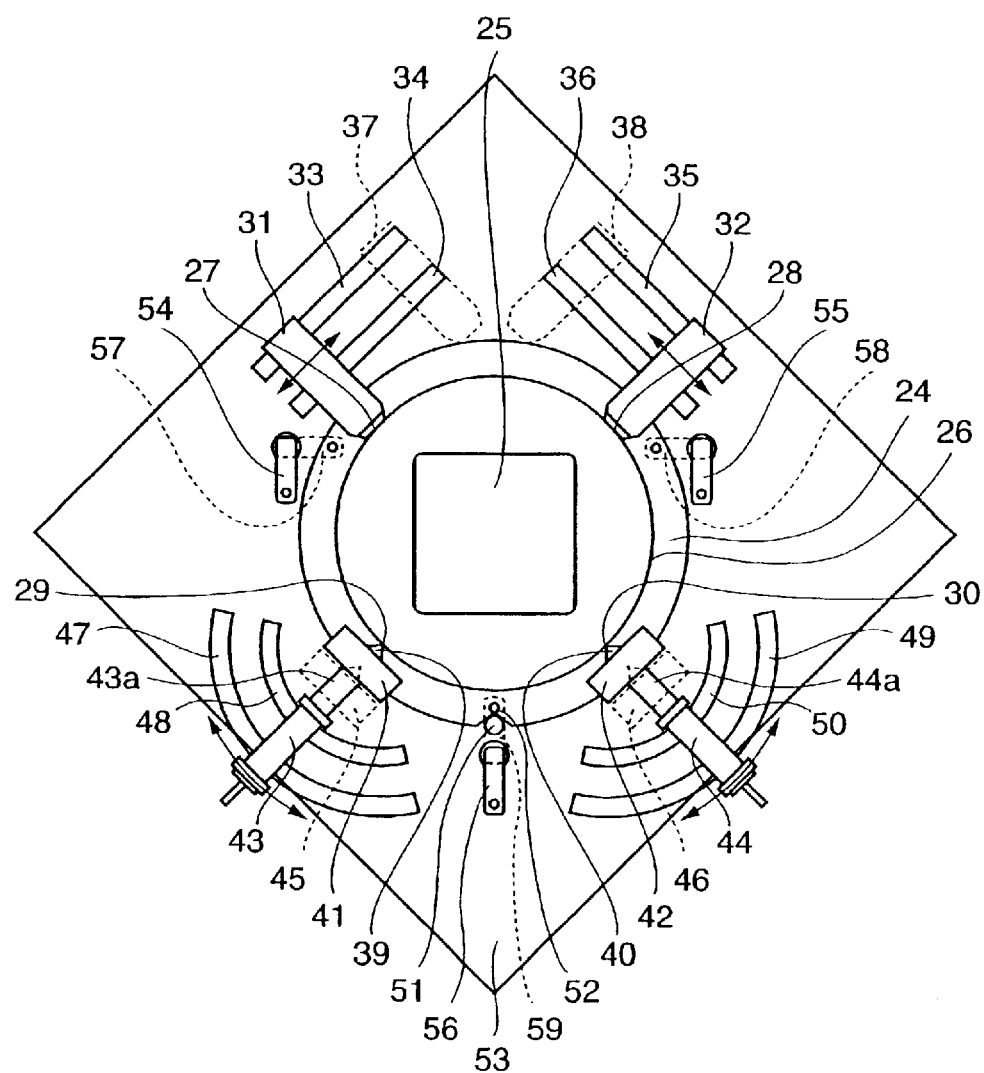
FIG. 4 is a plan view showing an apparatus which executes a mask pattern magnification correction method according to the first embodiment of the present invention.

FIG. 4 is a plan view showing an apparatus which executes a mask pattern magnification correction method according to the first embodiment of the present invention. In this embodiment, fixed points 27 and 28 and pressurizing points 29 and 30 are set on the outer periphery of a circular upper portion 26 of a support frame 24 on the extended lines of the two diagonal lines of a rectangular window 25 of the support frame 24 of a mask structure. As another embodiment, fixed points and pressurizing points may be set on the outer periphery of the circular lower portion of the support frame 24.

FIG. 4 will be compared with FIG. 1. Although the force Fc is applied to the pressurizing points 4 and 5 in FIG. 1, no pressurizing mechanisms are used at those points in FIG. 4. Instead, the fixed points 27 and 28 are received using receiving mechanisms which make fixed blade edges 31 and 32 abut against the fixed points 27 and 28. With this arrangement, the pressurizing mechanisms are simplified, and the mask structure is positioned by butt-receiving the fixed points. The entire receiving mechanisms including the fixed blade edges 31 and 32 are installed on rails 33 and 34 and rails 35 and 36, respectively. The mechanisms can slide in parallel to the tangential directions of the outer periphery of the circular upper portion 26, as indicated by arrows, and function so as not to restrain reducing deformation of the mask structure. When the mask structure is to be attached or detached, the fixed blade edges 31 and 32 can retreat to positions 37 and 38 indicated by corresponding broken lines, respectively.

Pressurized blade edges 39 and 40 individually have pressure force detection sections 41 and 42 formed from load cells or the like and are fixed to retractable rods 43a and 44a of actuators 43 and 44 which generate the force Fc shown in FIG. 1. When the mask structure is to be attached or detached, the pressurized blade edges 39 and 40 can retreat to positions 45 and 46 indicated by corresponding broken lines, respectively.

The pressurizing mechanisms with the pressurized blade edges 39 and 40, including the actuators 43 and 44, are installed on rails 47 and 48 and rails 49 and 50, respectively. The mechanisms can turn about the pressurizing points 29 and 30 in directions indicated by arrows so as to apply a force corresponding to the resultant force of the force Fa in the X-axis direction and the force Fb in the Y-axis direction, which are set to obtain the desired different magnifications in the X- and Y-axis directions, as shown in FIG. 1.

A pin 51 regulates the direction of the mask substrate by a notch portion 52 as a V-shaped groove of the support frame 24. The pin 51 has a retreat function to hide itself under a base plate 53 or slide in the horizontal direction.

Reference numerals 54 to 56 denote mask fixing portions. The mask fixing portions 54 to 56 turn to positions 57 to 59 indicated by broken lines whereby the support frame 24 of the mask structure is sandwiched and fixed between the mask fixing portions 54 to 56 and three balls (not shown).

When the apparatus shown in FIG. 4 is used as an X-ray mask holding apparatus of an X-ray exposure apparatus, the apparatus can be used to execute a method of irradiating the mask substrate with X-rays while keeping a force applied to the support frame 24 such that desired corrected magnifications can be obtained in the X- and Y-axis directions and transferring the mask pattern 18 onto a wafer serving as a photosensitive substrate.

In addition, when the apparatus shown in FIG. 4 is used as a mask holding apparatus in drawing a mask pattern using an electron beam or the like, the apparatus can be used to execute a method of drawing a mask pattern while keeping the membrane distorted by a predetermined force.

Figure 5:
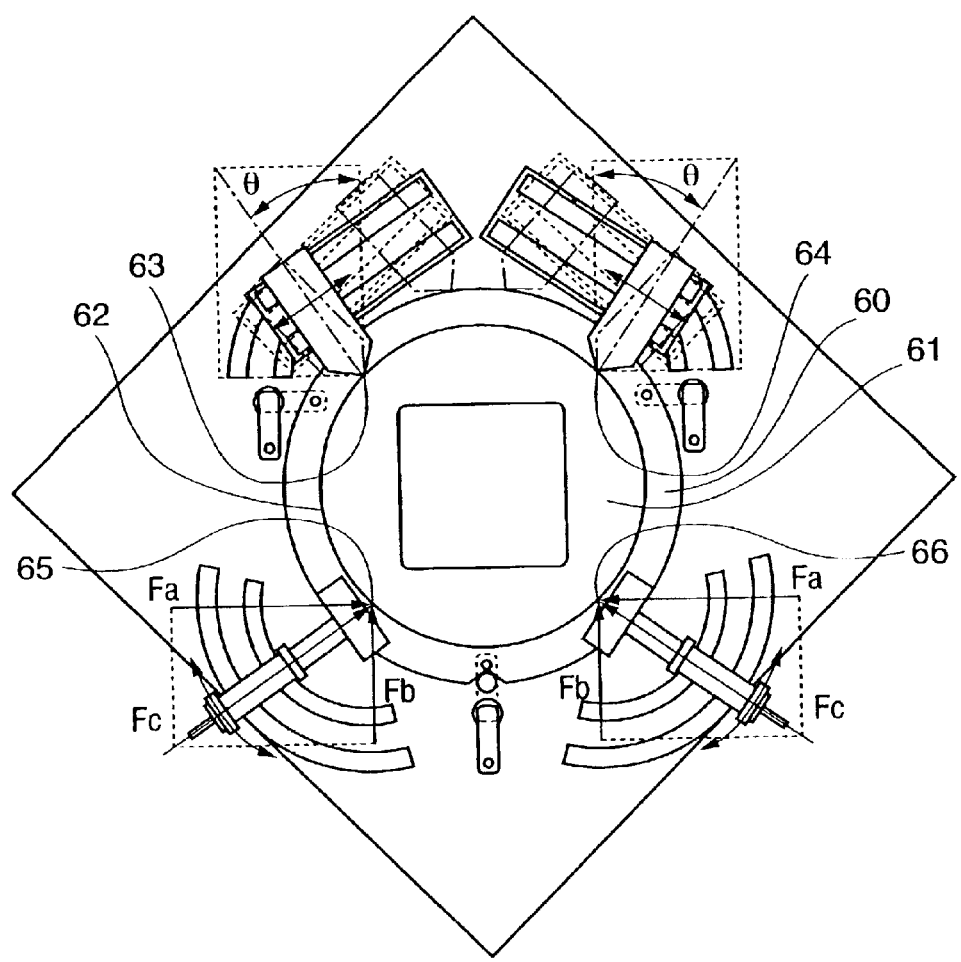
FIG. 5 is a plan view showing an apparatus which executes a mask pattern magnification correction method according to the second embodiment of the present invention.

FIG. 5 is a plan view showing an apparatus which executes a mask pattern magnification correction method according to the second embodiment of the present invention. Fixed points 63 and 64 and pressurizing points 65 and 66 are set on the outer periphery 62 of a circular upper portion of a support frame 60 on the extended lines of the two diagonal lines of a rectangular window 61 of the support frame 60 of a mask structure. A force Fc is applied to the pressurizing points 65 and 66. FIG. 5 will be compared with FIG. 1. Although the force Fc is applied to the pressurizing points 4 and 5 in FIG. 1, the fixed points 63 and 64 are used in FIG. 5. With this arrangement, the pressurizing mechanisms are simplified, and the mask structure is positioned by butt-receiving the fixed points.

The receiving mechanisms for receiving the fixed points 63 and 64 can slide in directions indicated by arrows. An angle θ that determines the sliding direction is set in correspondence with the ratio of a force Fa to a force Fc, which are obtained by decomposing the force Fc applied to the pressurizing points 65 and 66 in the X- and Y-axis directions.

The receiving mechanisms for the fixed points 27 and 28 in FIG. 4 can slide in parallel to the tangential directions, as indicated by arrows. Referring to FIG. 5, mechanisms for changing the sliding directions are added. This arrangement can decrease a residue other than rectangular reducing modification generated when the magnification difference, i.e., the difference between the X-axis magnification and the Y-axis magnification is increased.

Figure 6:
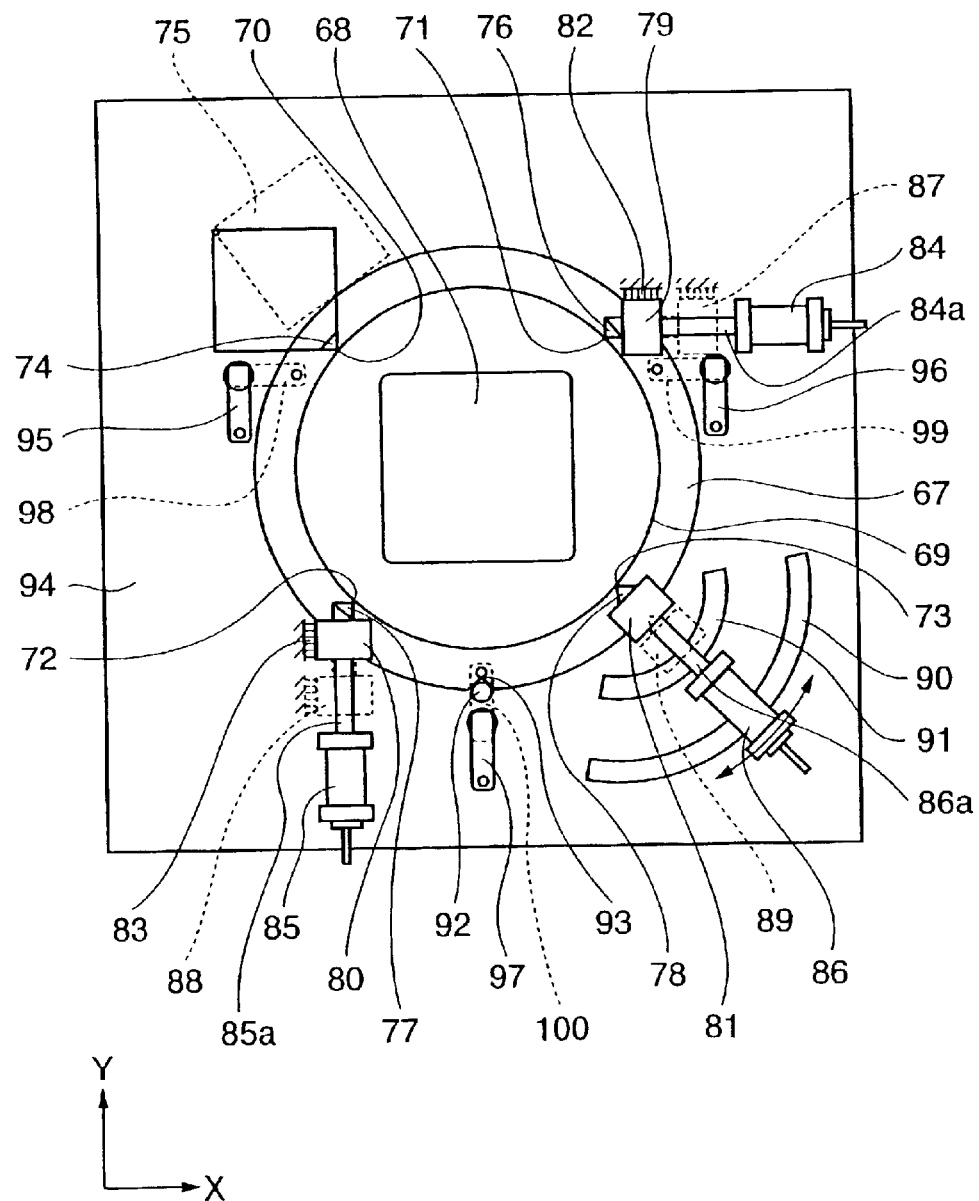
FIG. 6 is a plan view showing an apparatus which executes a mask pattern magnification correction method according to the third embodiment of the present invention.

FIG. 6 is a plan view showing an apparatus which executes a mask pattern magnification correction method according to the third embodiment of the present invention. The X- and Y-axes are defined in parallel to corresponding sides with respect to a rectangular window 68, as shown in FIG. 6. A fixed point 70 is defined on an outer periphery of a circular upper portion 69 of a support frame 67 on the extended line of a diagonal line of the rectangular window 68. A force in the X-axis direction is applied to a pressurizing point 71 that is present on a line extended from the fixed point 70 in the X-axis direction. A force in the Y-axis direction is applied to a pressurizing point 72 that is present on a line extended from the fixed point 70 in the Y-axis direction. A resultant force of a force Fa in the X-axis direction and a force Fb in the Y-axis direction is applied to a pressurizing point 73 that is present in a diagonal direction of the fixed point 70. The pressurizing point 71 does not move in the Y-axis direction. The pressurizing point 72 does not move in the X-axis direction.

A fixed blade edge 74 is firmly fixed while a force is being applied to the support frame 67. When a mask structure is to be attached or detached, the fixed blade edge 74 can retreat to a position indicated by a broken line.

Pressurized blade edges 76 to 78 have pressure force detection sections 79 to 81 formed from load cells or the like, respectively. The pressurized blade edges 76 and 77 have sliders 82 and 83, respectively. Hence, the pressurized blade edges 76 and 77 slide in the X- and Y-axis directions and resist against forces in the Y- and X-axis directions perpendicular to the directions of forces.

The pressurized blade edges 76 to 78 are fixed to retractable rods 84a to 86a of actuators 84 to 86 which generate the force. When the mask structure is to be attached or detached, the pressurized blade edges 76 to 78 can retreat to positions 87 to 89 indicated by broken lines, respectively.

The pressurizing mechanism with the pressurized blade edge 78, including the actuator 86, is installed on rails 90 and 91. The mechanism can turn about the pressurizing point 73 in a direction indicated by an arrow.

A pin 92 regulates the direction of the mask substrate by a notch portion 93 as a V-shaped groove of the support frame 67. The pin 92 has a retreat function to hide itself under a base plate 94 or slide in the horizontal direction.

Reference numerals 95 to 97 denote mask fixing portions. The mask fixing portions 95 to 97 turn to positions 98 to 100 indicated by broken lines whereby the support frame 67 of the mask structure is sandwiched and fixed between the mask fixing portions 95 to 97 and three balls (not shown).

Figure 7:
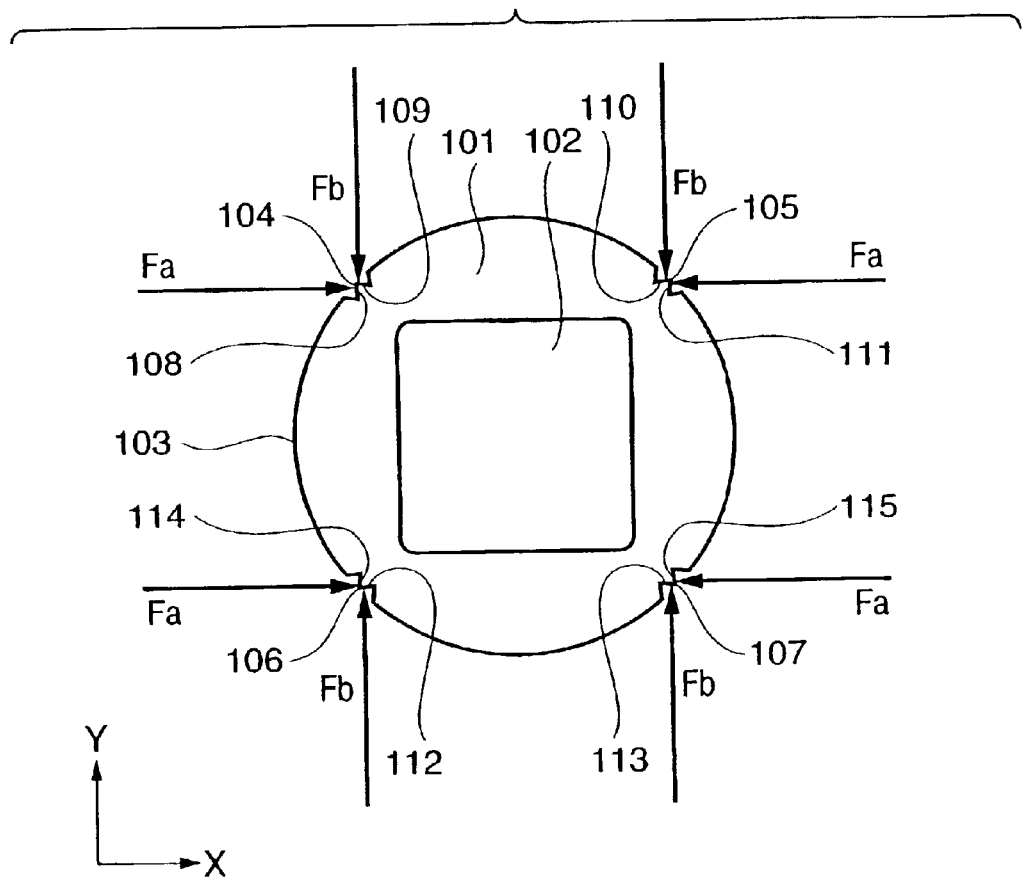
FIG. 7 is a plan view showing an example in which a force is decomposed in the X- and Y-axis directions and applied to a support frame using a support frame having W-shaped grooves.

FIG. 7 is a plan view for explaining an example in which a force is decomposed in the X- and Y-axis directions parallel to the sides of a rectangular window 102 and applied to a support frame 101 using W-shaped grooves formed in the support frame. The support frame 101 of a mask structure has W-shaped grooves 104 to 107 on an outer periphery 103 of the circular upper portion or circular lower portion. Pressurizing points 108 to 115 are set for pressurizing in the X-axis direction and pressurizing in the Y-axis direction. Instead of the resultant force Fc, as in FIG. 1, the decomposed forces Fa and Fb are applied.

As shown in FIG. 7, this method in which the force is decomposed in the X- and Y-axis directions and applied can easily cope with magnification correction when the force in the X- or Y-axis direction is zero or almost zero.

Figure 8:
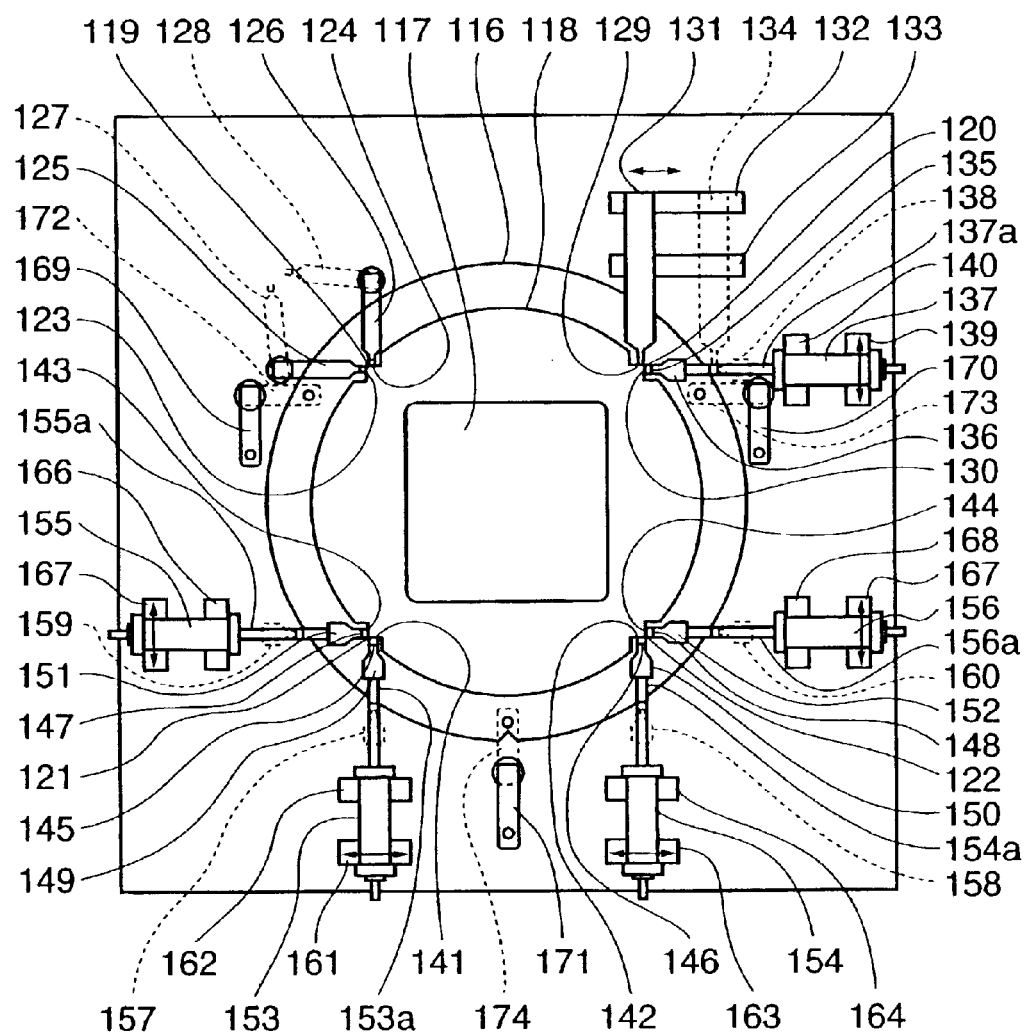
FIG. 8 is a plan view showing an apparatus which executes a mask pattern magnification correction method according to the fourth embodiment of the present invention.

FIG. 8 is a plan view showing an apparatus which executes a mask pattern magnification correction method according to the fourth embodiment of the present invention. Referring to FIG. 8, a support frame 116 of a mask structure has W-shaped grooves 119 to 122 on the outer periphery of a circular upper portion 118 on the extended lines of the two diagonal lines of a rectangular window 117.

Fixed points 123 and 124 on the upper left side in FIG. 8 are defined at the portion of the W-shaped groove 119. During magnification correction operation, a receiving mechanism for receiving the fixed points 123 and 124 is in a stationary state. When the mask structure is to be attached or detached, fixed blade edges 125 and 126 retreat to positions 127 and 128 indicated by broken lines. A fixed point 129 and pressurizing point 130 are present at the portion of the W-shaped groove 120 on the upper right side in FIG. 8. FIGS. 7 and 8 will be compared. The fixed points 123 and 124 in FIG. 8 are defined in place of the pressurizing points 108 and 109 in FIG. 7. The fixed point 129 is defined in FIG. 8 in place of the pressurizing point 110 in FIG. 7.

A receiving mechanism with a fixed blade edge 131 on the upper right side in FIG. 8 is installed on rails 132 and 133 and can slide in directions indicated by an arrow. This receiving mechanism does not move in a direction perpendicular to the direction of the arrow and functions so as not to restrain reducing deformation of the mask structure. When the mask structure is to be attached or detached, the fixed blade edge 131 retreats to a position 134 indicated by a broken line.

A pressurized blade edge 135 has a pressure force detection-section 136 formed from a load cell or the like and is fixed to a retractable rod 137*a* of an actuator 137 which generates the force Fa. When the mask structure is to be attached or detached, the pressurized blade edge 135 can retreat to a position 138.

The pressurizing mechanism with the pressurized blade edge 135, including the actuator 137, is installed on rails 139 and 140 and can slide in directions indicated by arrows.

Pressurizing points 141 to 144 are present at the portions of the W-shaped grooves 121 and 122. Pressurized blade edges 145 to 148 have pressure force detection sections 149 to 152 formed from load cells or the like and are fixed to retractable rods 153*a* to 156*a* of actuator 153 to 156 which generate the force. When the mask structure is to be attached or detached, the pressurized blade edges 145 to 148 can retreat to positions 157 to 160, respectively.

The pressurizing mechanisms with the pressurized blade edges 145 to 148, including the actuator 153 to 156, are installed on rails 161 to 168 and can slide in directions indicated by arrows.

Reference numerals 169 to 171 denote mask fixing portions. The mask fixing portions 169 to 171 turn to positions 172 to 174 indicated by broken lines whereby the support frame 116 of the mask structure is sandwiched and fixed between the mask fixing portions 169 to 171 and three balls (not shown).

When the apparatus shown in FIG. 8 is used as an X-ray mask holding apparatus of an X-ray exposure apparatus, the apparatus can be used to execute a method of irradiating the mask substrate with X-rays while keeping a force applied to the support frame 116 such that desired corrected magnifications can be obtained in the X- and Y-axis directions and transferring the mask pattern onto the wafer.

In addition, when the apparatus shown in FIG. 8 is used as a mask holding apparatus in drawing a mask pattern using an electron beam or the like, the apparatus can be used to execute a method of drawing a mask pattern while keeping the membrane distorted by a predetermined force.

Figure 9:
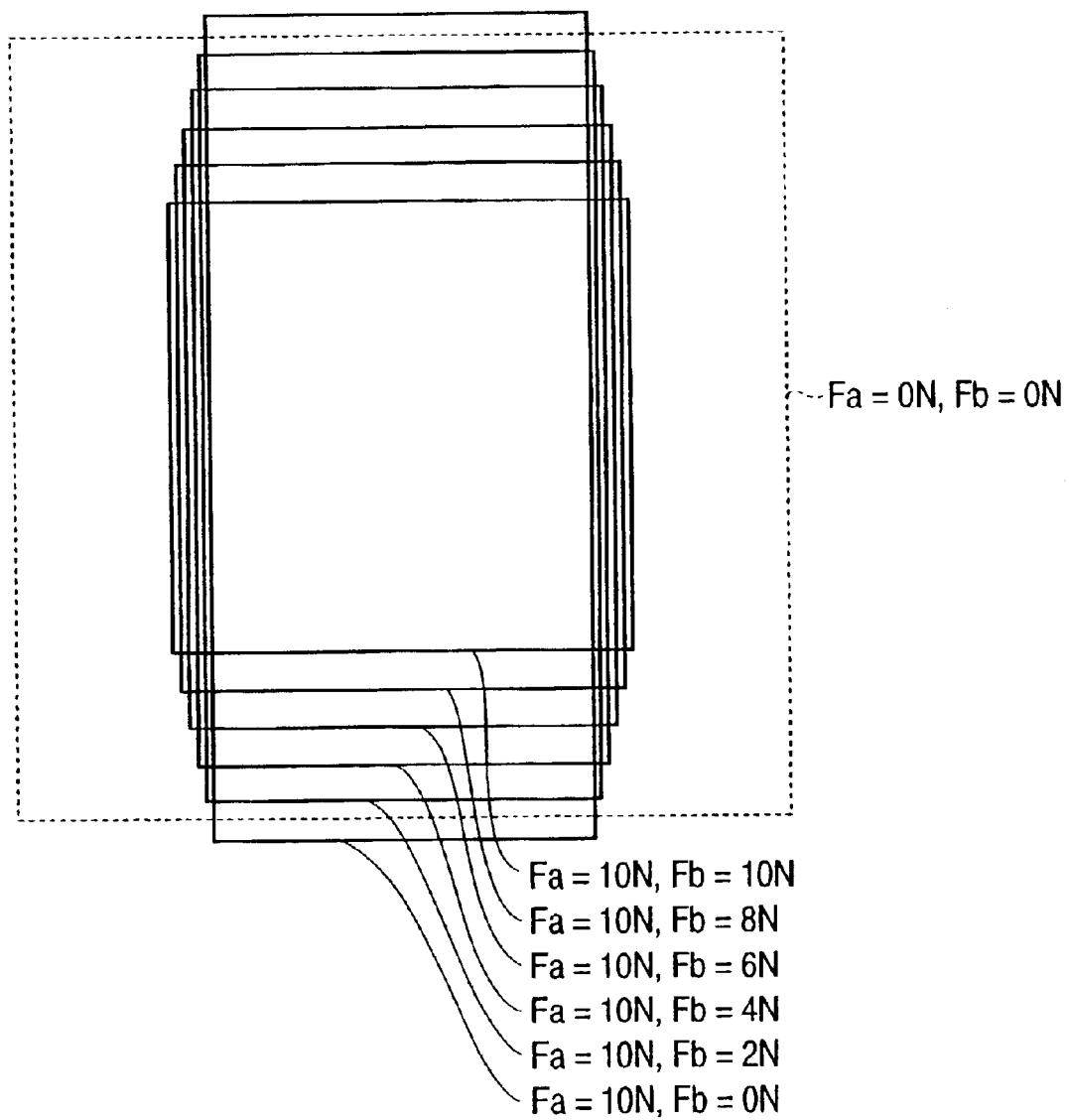
FIG. 9 is a view showing a change in shape of a rectangular window when forces Fa and Fb are changed by the magnification correction method shown in FIG. 8.

FIG. 9 is an enlarged view showing a state wherein the rectangular window changes when the magnitudes of the forces Fa and Fb applied to the outer periphery of the circular upper portion of the support frame are changed in the magnification correction method shown in FIG. 7. In the example shown in FIG. 9, the square indicated by the broken line represents a rectangular window size in a natural state.

When the forces Fa and Fb have the same magnitude (in FIG. 9, Fa=10N and Fb=10N), the reduction magnification in the X-axis direction equals that in the Y-axis direction. Hence, the rectangular window becomes a square window having a size indicated by a solid line. However, when the magnitude of the force Fa is different from that of the force Fb, the reduction magnifications in the X- and Y-axis directions are corrected. The square window changes to a rectangular window.

Figure 10:
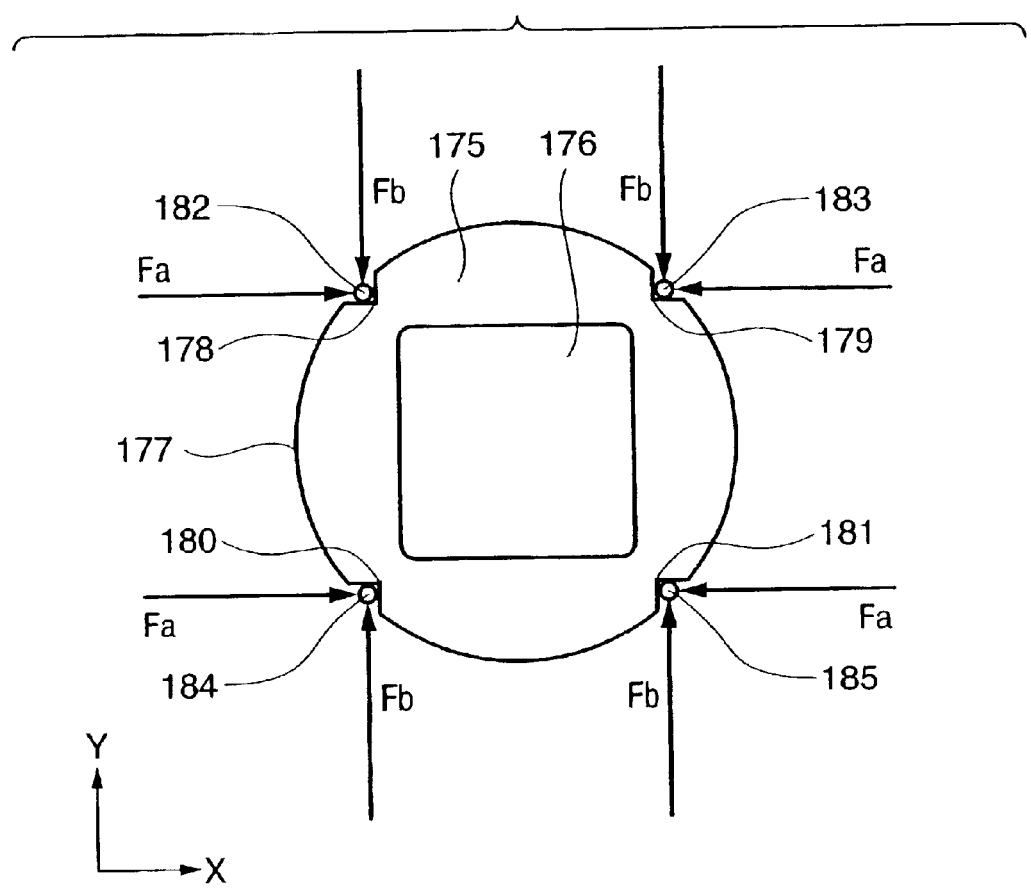
FIG. 10 is a plan view showing an example in which a force is decomposed in the X- and Y-axis directions and applied to a support frame using a support frame having V-shaped grooves.

FIG. 10 is a plan view for explaining an example in which a force is decomposed in the X- and Y-axis directions parallel to the sides of a rectangular window 176 and applied to a support frame 175 using V-shaped grooves formed in the support frame in the mask pattern magnification correction method according to the present invention. The support frame 175 of a mask structure has V-shaped grooves 178 to 181 on an outer periphery 177 of a circular upper portion or circular lower portion. Forces Fa and Fb are applied to the V-shaped grooves by balls 182 to 185 serving as rolling contactable portions. As the rolling contactable portions, not the balls, but cylinders may be used.

Figure 11:
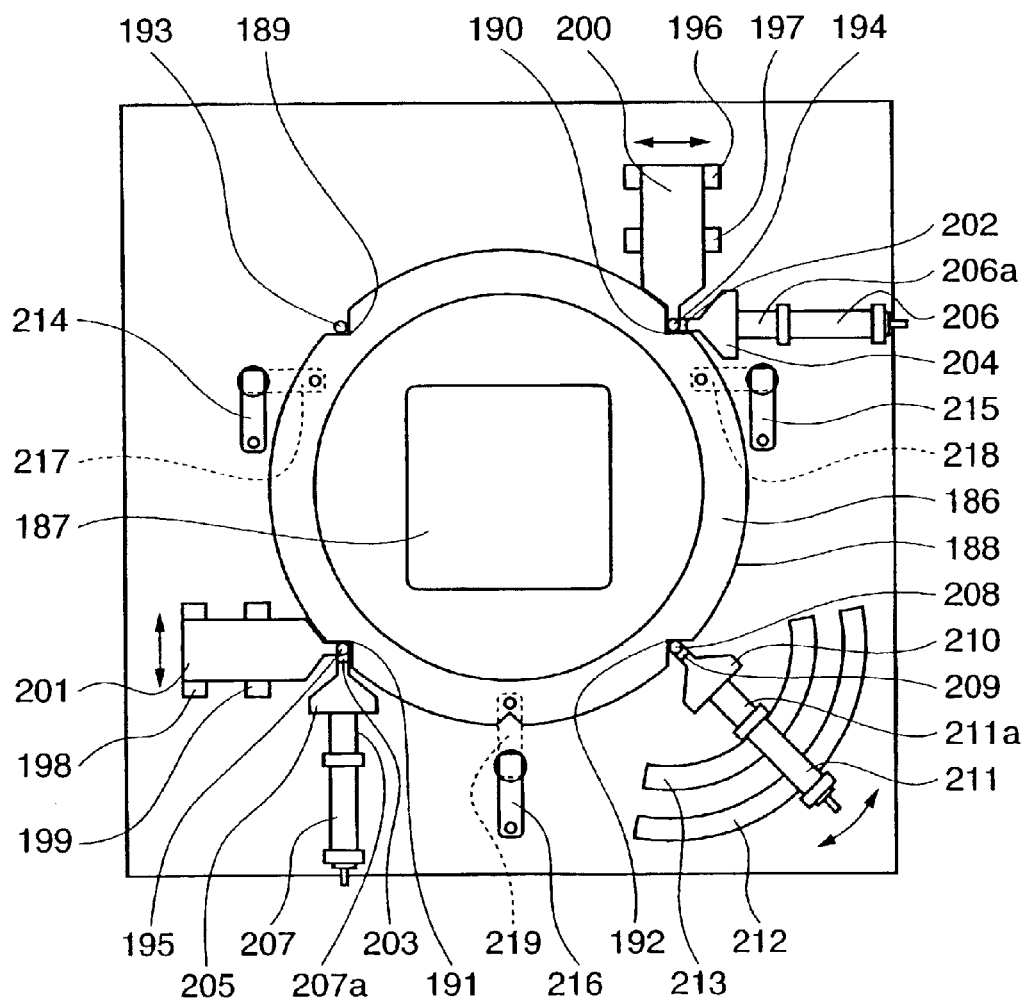
FIG. 11 is a plan view showing an apparatus which executes a mask pattern magnification correction method according to the fifth embodiment of the present invention.

FIG. 11 is a plan view showing an apparatus which executes a mask pattern magnification correction method according to the fifth embodiment of the present invention. A support frame 186 of a mask structure has V-shaped grooves 189 to 192 on an outer periphery of a circular lower portion 188 on the extended lines of the two diagonal lines of a rectangular window 187. As another embodiment, fixed points and pressurizing points may be set at V-shaped grooves that are formed on the outer periphery of the circular upper portion of the support frame 186.

FIG. 11 will be compared with FIG. 10. Although the forces Fa and Fb act on the ball 182 in FIG. 10, a mechanism using a ball 193 set at a fixed point is used in FIG. 11. The ball 193 may have a moving function for attachment/detachment of a mask structure or to adjust the position. The ball 193 is in a stationary state during a magnification correction operation.

Although the force Fb acts on the ball 183, and the force Fa acts on the ball 184 in FIG. 10, balls 194 and 195 in FIG. 11 are fixed to sliders 200 and 201 installed on rails 196 and 197 and rails 198 and 199. The balls 194 and 195 can slide in directions indicated by arrows and do not move in directions perpendicular to the directions of arrows. The balls 194 and 195 function not to restrain reducing deformation of the mask structure.

Pressurizing sections 202 and 203 have pressure force detection sections 204 and 205 formed from load cells or the like and are fixed to retractable rods 206a and 207a of actuators 206 and 207 which generate the force.

The force is applied to the V-shaped groove portion 192 by a pressurizing section 209 through a ball 208. The pressurizing section 209 has a pressure force detection section 210 formed from a load cell or the like and is fixed to a retractable rod 211a of an actuator 211 which generates the force. The pressurizing mechanism with the pressurizing section 209, including the actuator 211, is installed on rails 212 and 213 and can slide about the ball 208 in directions indicated by arrows.

The balls 194, 195, and 208 serving as rolling contactable portions may be held at pressurized blade edges by a magnetic force so as to freely rotate.

Reference numerals 214 to 216 denote mask fixing portions. The mask fixing portions 214 to 216 turn to positions 217 to 219 indicated by broken lines whereby the support frame 186 of the mask structure is sandwiched and fixed between the mask fixing portions and three balls (not shown).

When the apparatus shown in FIG. 11 is used as an X-ray mask holding apparatus of an X-ray exposure apparatus, the apparatus can be used to execute a method of irradiating the mask substrate with X-rays while keeping a force applied to the support frame 186 such that desired corrected magnifications can be obtained in the X- and Y-axis directions and transferring the mask pattern onto the wafer.

In addition, when the apparatus shown in FIG. 11 is used as a mask holding apparatus in drawing a mask pattern using an electron beam or the like, the apparatus can be used to execute a method of drawing a mask pattern while keeping the membrane distorted by a predetermined force.

Figure 12:
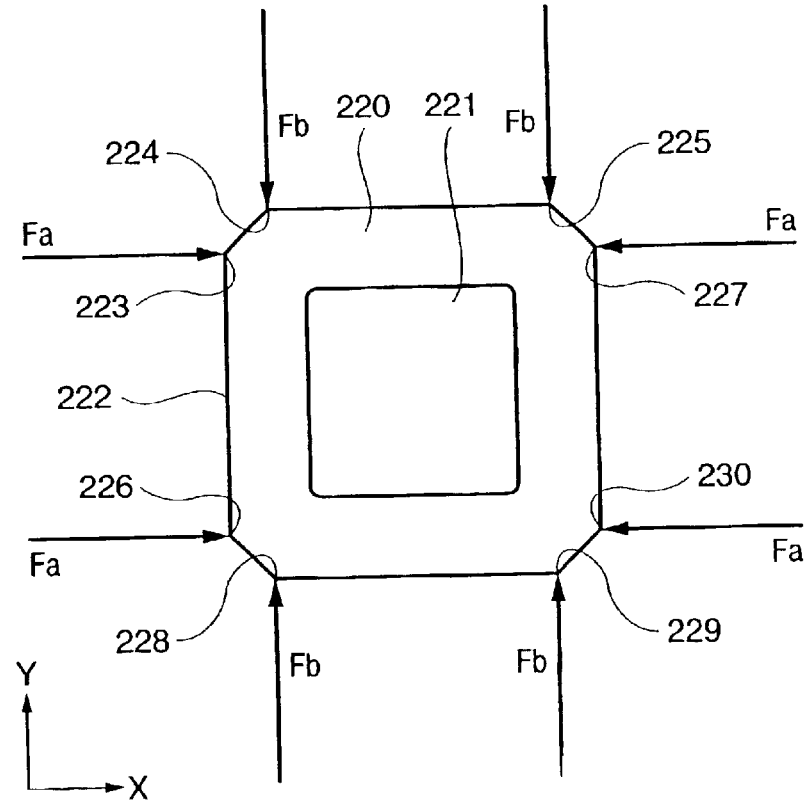
FIG. 12 is a plan view showing an example in which a force is decomposed in the X- and Y-axis directions and applied to a support frame using a support frame having a rectangular outer periphery.

FIG. 12 is a plan view for explaining an example in which a force is decomposed in the X- and Y-axis directions parallel to the sides of a rectangular window 221 and applied to a support frame 220 by forming a rectangular outer periphery on the outer periphery of the upper or lower portion of the support frame 220. In the support frame 220 of a mask structure, a rectangular outer periphery 222 parallel to the sides of the rectangular window 221 is formed. Pressurizing points 223 to 230 are set for pressurizing in the X-axis direction and pressurizing in the Y-axis direction. Forces Fa and Fb are applied to the sides of the rectangular outer periphery 222. In this case, the intersection between the extended lines of arrows that indicate the directions of the forces Fa and Fb near each chamfered portion of the support frame 220, i.e., the point of action of the resultant force of each set of forces Fa and Fb, e.g., the forces Fa and Fb at the pressurizing points 223 and 224 is located on the extended line upward to the left of the diagonal line downward to the right of the rectangular window 221.

Figure 13:
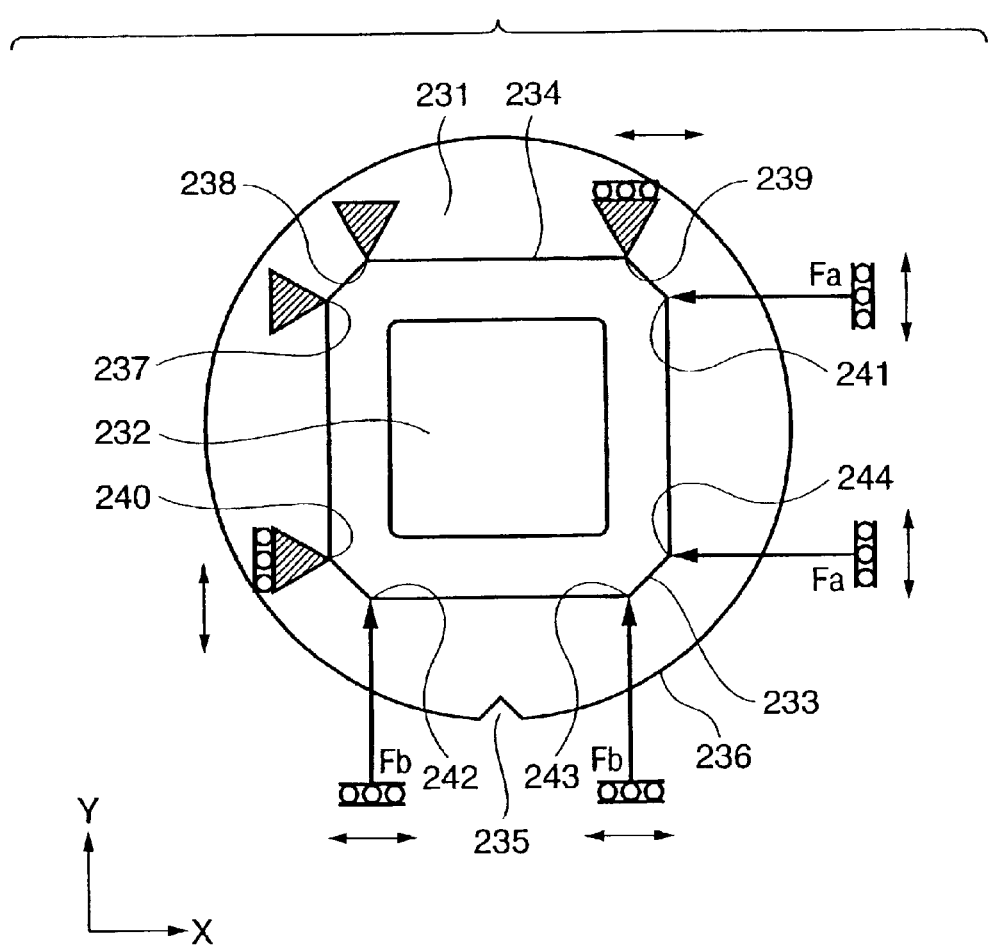
FIG. 13 is a schematic view showing an apparatus which executes a mask pattern magnification correction method according to the sixth embodiment of the present invention.

FIG. 13, will be compared with FIG. 12. Although the pressurizing points 223 and 224 are used in FIG. 12, a mechanism using fixed points 237 and 238 is used in FIG. 13. In addition, although the pressurizing points 225 and 226 are used in FIG. 12, fixed points 239 and 240 are received by receiving mechanisms that can slide in directions indicated by arrows in FIG. 13. The receiving mechanisms can slide in the directions indicated by the arrows and do not move in directions perpendicular to the directions of the arrows.

FIG. 13 will be compared with FIG. 12. Although the pressurizing points 223 and 224 are used in FIG. 12, a mechanism using fixed points 237 and 238 is used in FIG. 13. In addition, although the pressurizing points 225 and 226 are used in FIG. 12, fixed points 239 and 240 are received by receiving mechanisms that can slide in directions indicated by arrows in FIG. 13. The receiving mechanisms can slide in the directions indicated by the arrows and do not move in directions perpendicular to the directions of arrows.

Pressurizing mechanisms for forces Fa and Fb applied to pressurizing points 241 to 244 can slide in directions perpendicular to the directions indicated by the arrows and function not to restrain deformation of the mask structure. In this case as well, the intersection between the extended lines of the arrows that indicate the forces Fa and Fb near each chamfered portion of the support frame 231, i.e., the point of action of the resultant force of each set of forces Fa and Fb is located on one of the extended lines of the two diagonal lines of the rectangular window 232.

Figure 14:
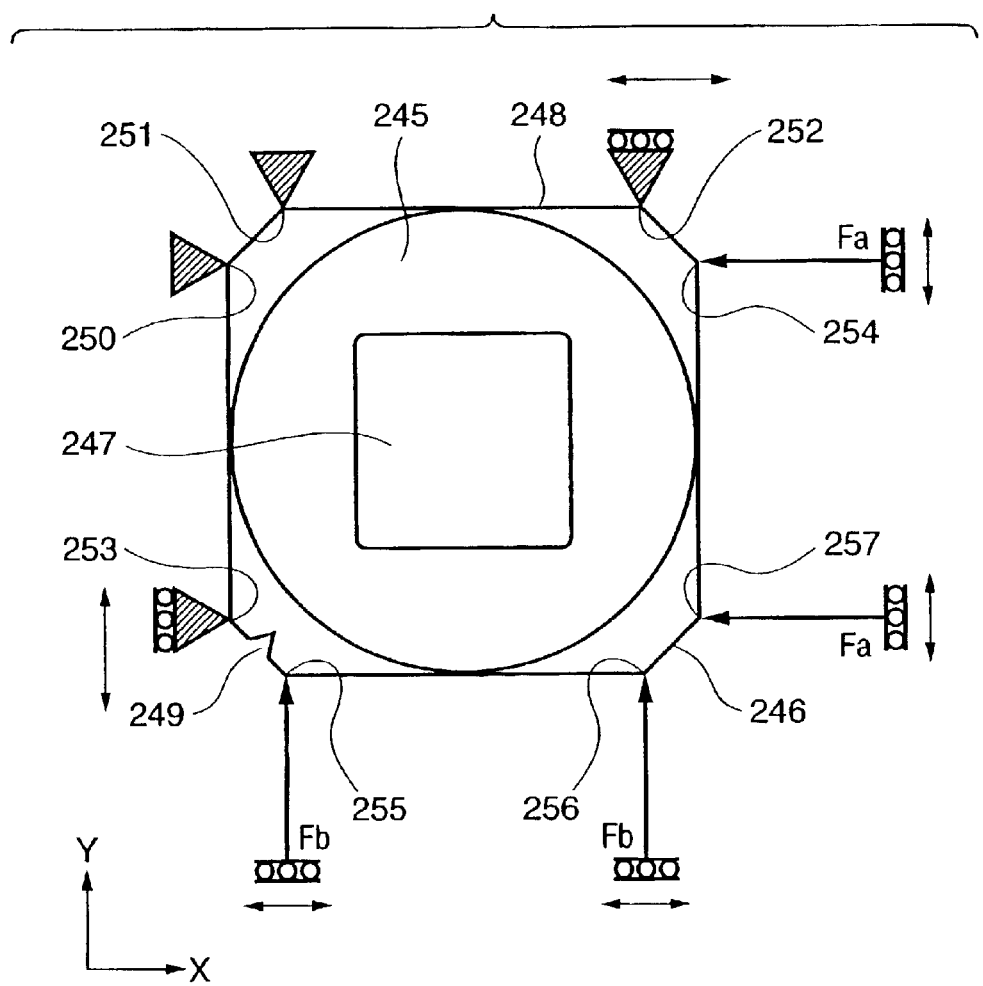
FIG. 14 is a schematic view showing an apparatus which executes a mask pattern magnification correction method according to the seventh embodiment of the present invention.
Figure 15:
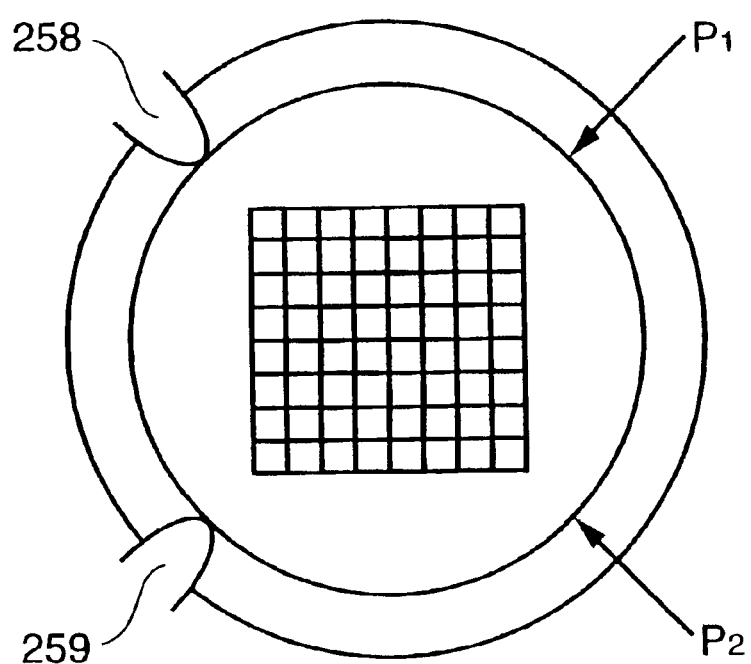
FIG. 15 is a view showing a conventional magnification correction method.

FIG. 14 is a schematic view showing an apparatus which executes a mask pattern magnification correction method according to the seventh embodiment of the present invention. In FIG. 13, the upper portion of the support frame has a rectangular shape. Referring to FIG. 14, the outer periphery of a lower portion 246 of a support frame 245 of a mask structure has a rectangular outer periphery 248 parallel to a rectangular window 247. A V-shaped groove as a notch portion 249 that defines the direction of the support frame 245 is formed at a chamfered portion of the outer periphery of the lower portion 246. However, the notch portion 249 may be formed on the rectangular outer periphery 248.

FIG. 14 will be compared with FIG. 12. Although the pressurizing points 223 and 224 are used in FIG. 12, receiving mechanisms for receiving fixed points 250 and 251 are used in FIG. 14. In addition, although the pressurizing points 225 and 226 are used in FIG. 12, fixed points 252 and 253 are received by receiving mechanisms that can slide in directions indicated by the arrows in FIG. 13. The receiving mechanisms can slide in the directions indicated by the arrows and do not move in directions perpendicular to the directions of the arrows.

Pressurizing mechanisms for forces Fa and Fb applied to pressurizing points 254 and 257 can slide in directions perpendicular to the directions indicated by the arrows and function not to restrain deformation of the mask structure. In this case as well, the intersection between the extended lines of arrows that indicated the forces Fa and Fb near each chamfered portion of the support frame 245, i.e., the point of action of the resultant force of each set of forces Fa and Fb is located on one of the extended lines of the two diagonal lines of the rectangular window 247.

(Embodiment of A Semiconductor Production System)

Next, an example of a semiconductor device (e.g., a semiconductor chip of an IC, LSI or the like, a liquid crystal panel, a CCD, a thin film magnetic head, a micromachine, etc.) production system using the apparatus of the present invention will be described. The system performs maintenance services such as trouble shooting, periodical maintenance or software delivery for fabrication apparatuses installed in a semiconductor manufacturing factory, by utilizing a computer network outside the fabrication factory.

Figure 16:
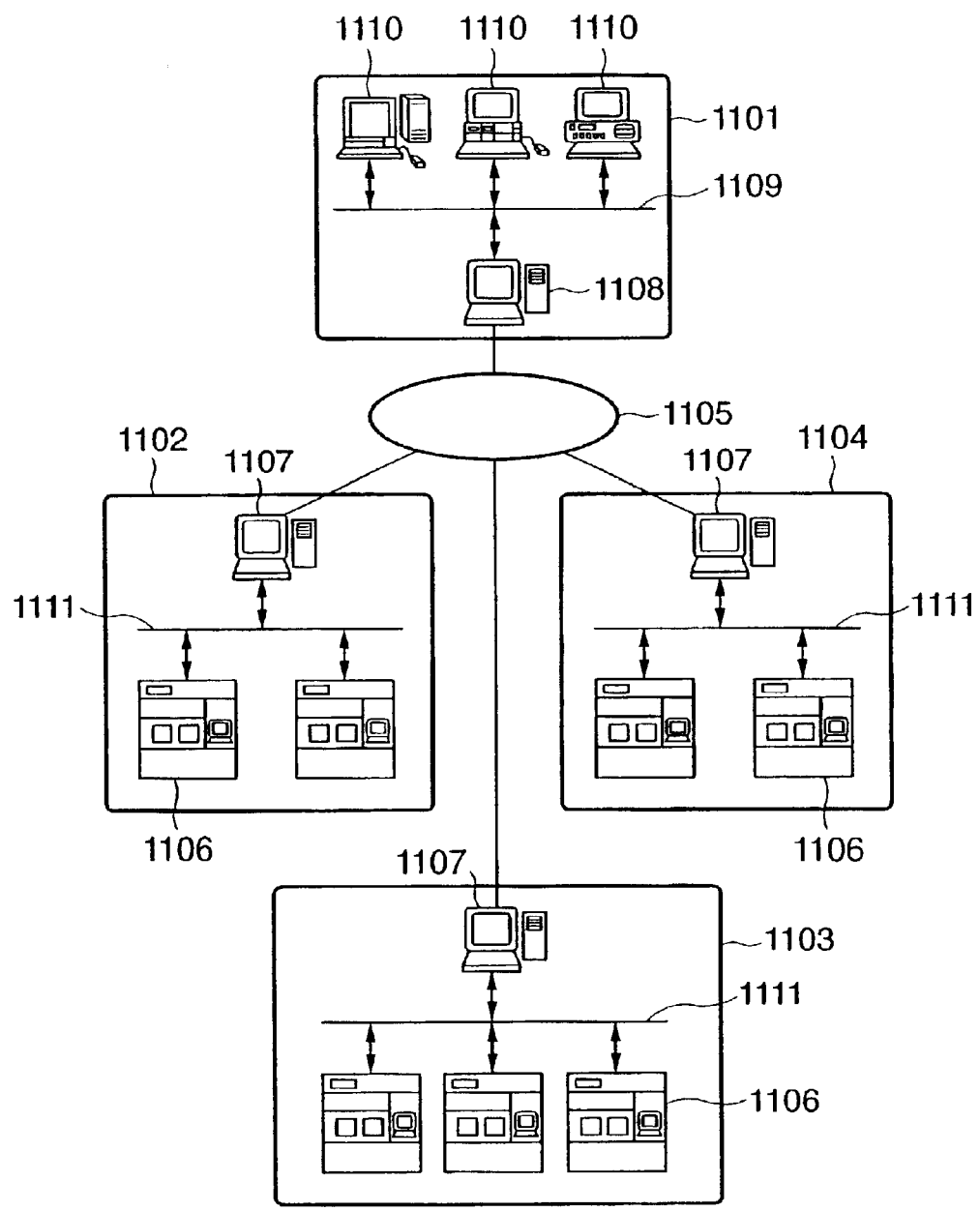
FIG. 16 is a conceptual diagram of a semiconductor device production system using the apparatus according to the embodiment, viewed from an angle.

FIG. 16 shows the entire system cut out from an angle. In the figure, numeral 1101 denotes the office of a vendor (apparatus maker) of semiconductor device fabrication apparatuses. As the semiconductor fabrication apparatuses, apparatuses in the semiconductor fabrication factory for performing various processes such as preprocess apparatuses (e.g., lithography apparatuses including an exposure apparatus, a resist processing apparatus and an etching apparatus, a heat processing apparatus, a film forming apparatus, a smoothing apparatus, and the like) and post-process apparatuses, (e.g., an assembly apparatus, an inspection apparatus and the like) are used. The office 1101 has a host management system 1108 to provide a maintenance database for the fabrication apparatus, plural operation terminal computers 1110, and a local area network (LAN) 1109 connecting them to construct an Intranet or the like. The host management system 1108 has a gateway for connection between the LAN 1109 and the Internet 1105 as an external network and a security function to limit access from the outside.

On the other hand, numerals 1102 to 1104 denote fabrication factories of semiconductor makers as users of the fabrication apparatuses. The fabrication factories 1102 to 1104 may belong to different makers or may belong to the same maker (e.g., preprocess factories and postprocess factories). The respective factories 1102 to 1104 are provided with plural fabrication apparatuses 1106, a local area network (LAN) 1111 connecting the apparatuses to construct an Intranet or the like, and a host management system 1107 as a monitoring apparatus to monitor operating statuses of the respective fabrication apparatuses 1106. The host management system 1107 provided in the respective factories 1102 to 1104 has a gateway for connection between the LAN 1111 and the Internet 1105 as the external network. In this arrangement, the host management system 1108 on the vendor side can be accessed from the LAN 1111 in the respective factories via the Internet 1105, and only limited user(s) can access the system by the security function of the host management system 1108. More particularly, status information indicating the operating statuses of the respective fabrication apparatuses 1106 (e.g. problem of fabrication apparatus having trouble) is notified from the factory side to the vendor side via the Internet 1105, and maintenance information such as response information to the notification (e.g. information indicating measure against the trouble, or remedy software or data), latest software, help information and the like is received from the vendor side via the Internet. The data communication between the respective factories 1102 to 1104 and the vendor 1101 and data communication in the LAN 1111 of the respective factories are performed by using a general communication protocol (TCP/IP). Note that as the external network, a private-line network (ISDN or the like) with high security against access from outsiders may be used in place of the Internet.

Further, the host management system is not limited to that provided by the vendor, but a database constructed by the user may be provided on the external network, to provide the plural user factories with access to the database.

Figure 17:
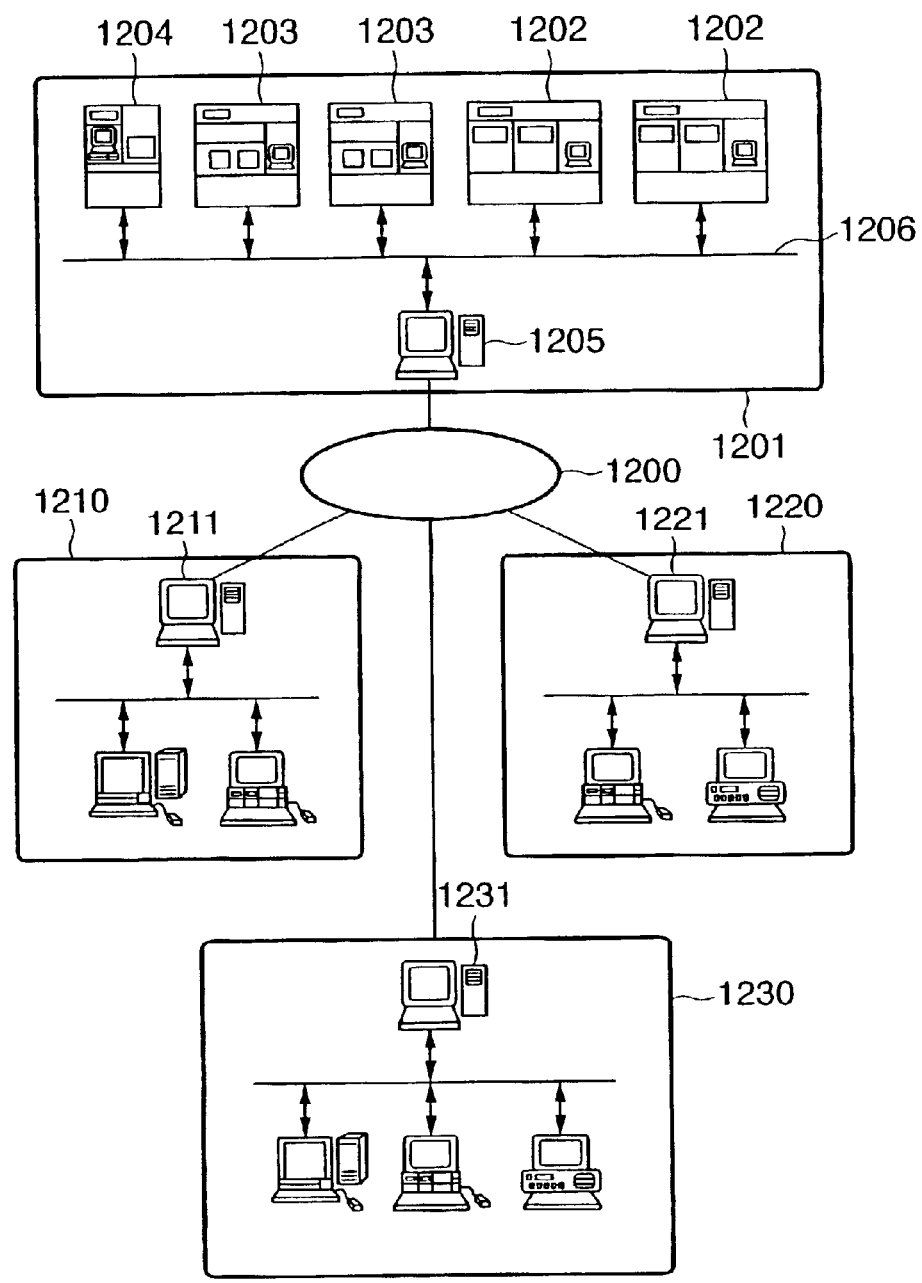
FIG. 17 is a conceptual diagram of the semiconductor device production system using the apparatus according to the embodiment, viewed from another angle.

FIG. 17 is a conceptual diagram showing the entire system of the present embodiment cut out from another angle different from that in FIG. 16. In the above example, the plural user factories respectively having fabrication apparatuses and the management system of the apparatus vendor are connected via the external network, and data communication is performed for production management for the respective factories and transmission of information on at least one fabrication apparatus. In this example, a factory having fabrication apparatuses of plural vendors is connected with management systems of the respective vendors of the fabrication apparatuses via the external network, and data communication is performed for transmission of maintenance information for the respective fabrication apparatuses. In the figure, numeral 1201 denotes a fabrication factory of a fabrication apparatus user (e.g., a semiconductor device maker). In the factory fabrication line, fabrication apparatuses for performing various processes, an exposure apparatus 1202, a resist processing apparatus 1203 and a film forming apparatus 1204, are used. Note that FIG. 17 shows only the fabrication factory 1201, however, actually, plural factories construct the network. The respective apparatuses of the factory are connected with each other by a LAN 1206 to construct an Intranet, and a host management system 1205 performs operation management of the fabrication line.

On the other hand, the respective office of vendors (apparatus makers), an exposure apparatus maker 1210, a resist processing apparatus maker 1220, a film forming apparatus maker 1230 have host management systems 1211, 1221 and 1231 for remote maintenance for the apparatuses, and as described above, the systems have the maintenance database and the gateway for connection to the external network. The host management system 1205 for management of the respective apparatuses in the user fabrication factory is connected with the respective vendor management systems 1211, 1221 and 1231 via the Internet or private-line network as an external network 1200. In this system, if one of the fabrication apparatuses of the fabrication line has trouble, the operation of the fabrication line is stopped. However, the trouble can be quickly removed by receiving the remote maintenance service from the vendor of the apparatus via the Internet 1200. Thus, the stoppage of the fabrication line can be minimized.

Figure 18:
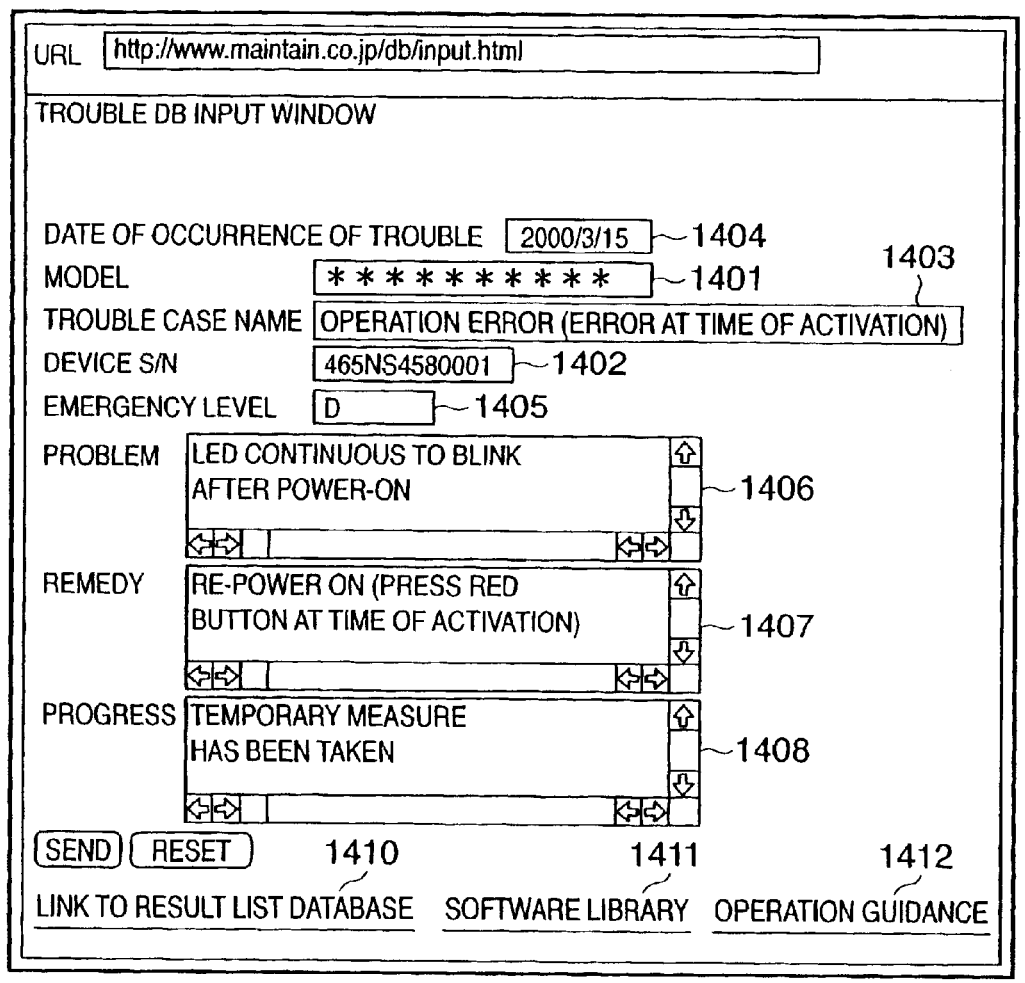
FIG. 18 is a particular example of a user interface.

The respective fabrication apparatuses installed in the semiconductor fabrication factory have a display, a network interface and a computer to execute network access software stored in a memory and device operation software. As a memory, an internal memory, a hard disk or a network file server may be used. The network access software, including a specialized or general web browser, provides a user interface screen image as shown in FIG. 18 on the display. An operator who manages the fabrication apparatuses in the factory checks the screen image and inputs information of the fabrication apparatus, a model 1401, a serial number 1402, a trouble case name 1403, a date of occurrence of trouble 1404, an emergency level 1405, a problem 1406, a remedy 1407 and a progress 1408, into input fields on the screen image. The input information is transmitted to the maintenance database via the Internet, and appropriate maintenance information as a result is returned from the maintenance database and provided on the display. Further, the user interface provided by the web browser realizes hyper link functions 1410 to 1412 as shown in the figure, and the operator accesses more detailed information of the respective items, downloads latest version software to be used in the fabrication apparatus from a software library presented by the vendor, and downloads operation guidance (help information) for the operator's reference. The maintenance information provided from the maintenance database includes the information on the above-described present invention, and the software library provides latest version software to realize the present invention.

Figure 19:
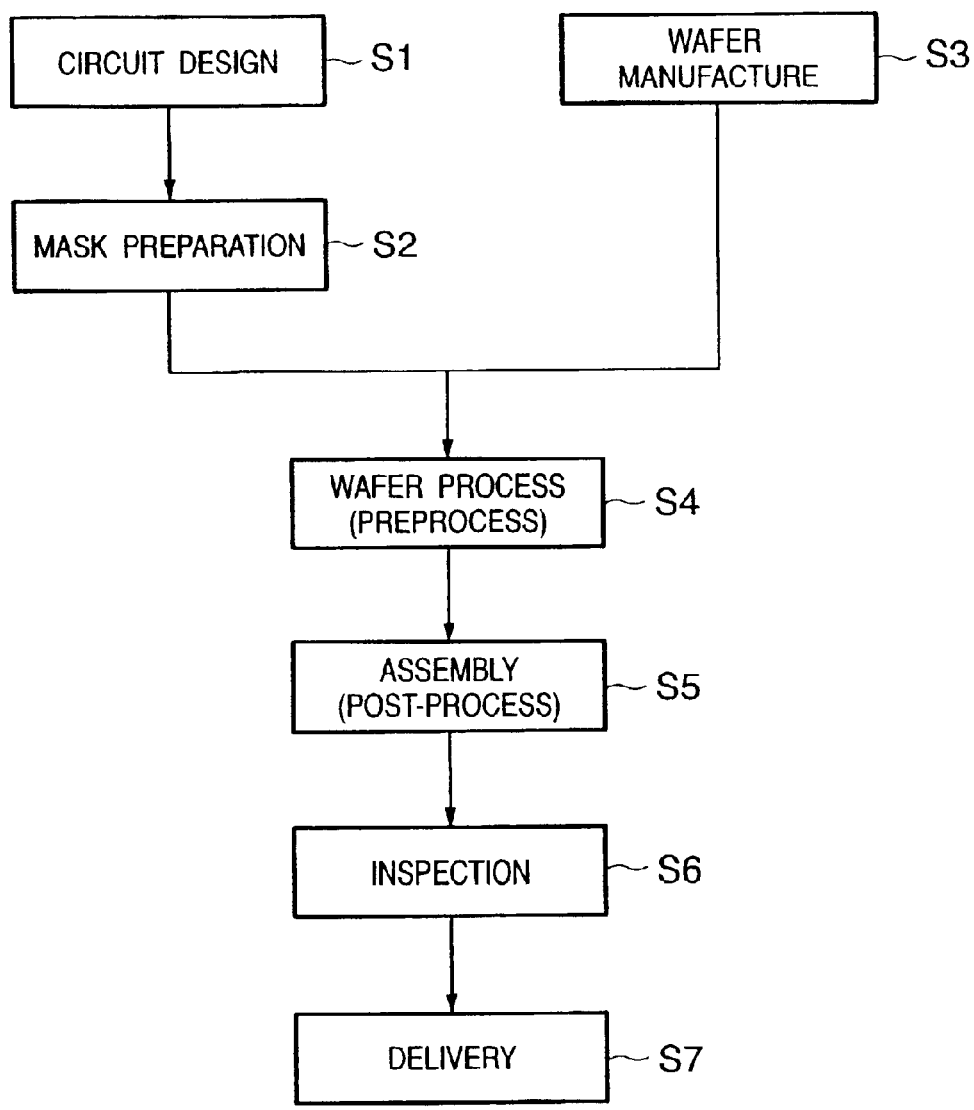
FIG. 19 is a flowchart showing a device fabrication process.

Next, a semiconductor device fabrication process utilizing the above-described production system will be described. FIG. 19 shows a flow of the entire semiconductor fabrication process. At step S1 (circuit designing), a circuit designing of the semiconductor device is performed. At step S2 (mask fabrication), a mask where the designed circuit pattern is formed is fabricated. On the other hand, at step S3 (wafer fabrication), a wafer is fabricated using silicon or the like. At step S4 (wafer process), called a preprocess, the above mask and wafer are used. An actual circuit is formed on the wafer by lithography. At step S5 (assembly), called a postprocess, a semiconductor chip is formed by using the wafer at step S4. The postprocess includes processing such as an assembly process (dicing and bonding) and a packaging process (chip sealing). At step S6 (inspection), inspection such as an operation test and a durability test are performed on the semiconductor device assembled at step S5. The semiconductor device is completed through these processes, and it is shipped (step S7). The preprocess and the postprocess are independently performed in specialized factories, and maintenance is made for these factories by the above-described remote maintenance system. Further, data communication is performed for production management and/or apparatus maintenance between the preprocess factory and the postprocess factory via the Internet or private-line network.

Figure 20:
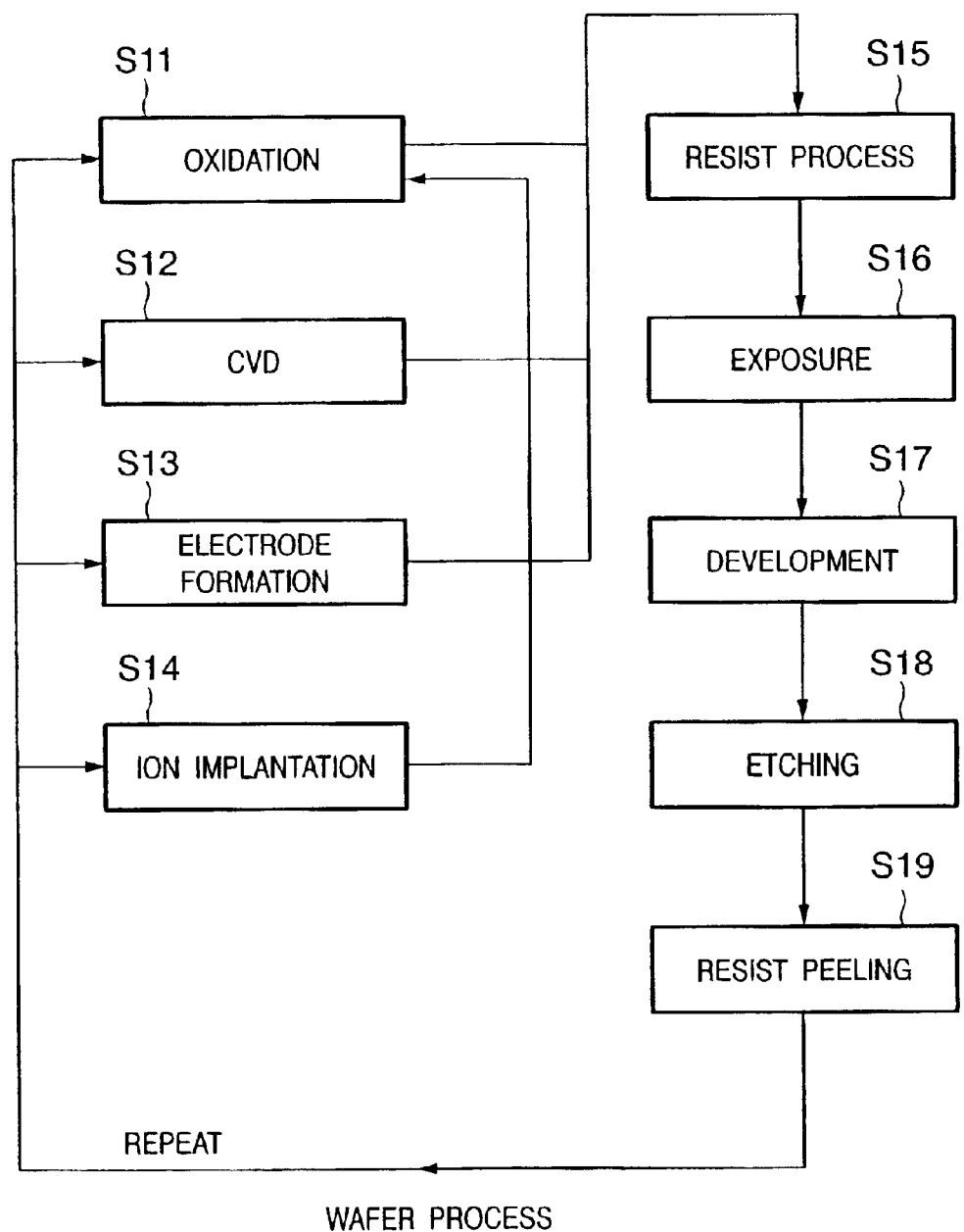
FIG. 20 is a flowchart showing a wafer process.

FIG. 20 shows a more detailed flow of the wafer process. At step S11 (oxidation), the surface of the wafer is oxidized. At step S12 (CVD), an insulating film is formed on the surface of the wafer. At step S13 (electrode formation), electrodes are formed by vapor deposition on the wafer. At step S14 (ion implantation), ions are injected into the wafer. At step S15 (resist processing), the wafer is coated with photoresist. At step S16 (exposure), the above-described exposure apparatus exposure-transfers the circuit pattern of the mask onto the wafer. At step S17 (development), the exposed wafer is developed. At step S18 (etching), portions other than the resist image are etched. At step S19 (resist stripping), the resist unnecessary after the etching is removed. These steps are repeated, thereby multiple circuit patterns are formed on the wafer. As maintenance is performed on the fabrication apparatuses used in the respective steps by the above-described remote maintenance system, trouble is prevented, and even if it occurs, quick recovery can be made. In comparison with the conventional art, the productivity of the semiconductor device can be improved.

[Other Embodiment]

The present invention includes a case wherein the object of the present invention can be also achieved by providing a software program for performing the functions of the above-described embodiments of the magnification correction method to a system or an apparatus from a remote position, and reading and executing the program code with a computer of the system or apparatus. In such a case, the form of the software is not necessarily a program as long as it has a function of a program.

Accordingly, to realize the functional processing of the present invention by the computer, the program code itself installed in the computer realizes the present invention. That is, the claims of the present invention include a computer program itself to realize the functional processing of the present invention.

In such a case, the other form of a program may be such as a program executed by object code, an interpreter and the like, or script data to be supplied to an OS (Operating System), as long as it has the function of a program.

As a storage medium for providing the program, a floppy disk, a hard disk, an optical disk, a magneto-optical disk, an MO, a CD-ROM, a CD-R, a CD-RW, a magnetic tape, a non-volatile type memory card, a ROM, a DVD (a DVD-ROM and a DVD-R) or the like can be used.

Further, the program may be provided by accessing a home page on the Internet by using a browser of a client computer, and downloading the computer program itself of the present invention or a compressed file having an automatic installation function from the home page to a storage medium such as a hard disk. Further, the present invention can be realized by dividing program code constructing the program of the present invention into plural files, and downloading the respective files from different home pages. That is, the claims of the present invention also include a WWW server holding the program file to realize the functional processing of the present invention to be downloaded to plural users.

Further, the functional processing of the present invention can be realized by encrypting the program of the present invention and storing the encrypted program into a storage medium such as a CD-ROM, delivering the storage medium to users, permitting a user who satisfied a predetermined condition to download key information for decryption from the home page via the Internet, and having the user execute the program by using the key information and install the program into the computer.

Furthermore, the present invention also includes a case wherein, after the program code read from the storage medium is written in a function expansion board, which is inserted into the computer or in a memory, provided in a function expansion unit, which is connected to the computer, a CPU or the like contained in the function expansion board or unit performs a part or entire process in accordance with designations of the program code and realizes functions of the above embodiments.

Furthermore, the present invention also includes a case where, after the program code read from the storage medium is written in a function expansion board which is inserted into the computer or in a memory provided in a function expansion unit which is connected to the computer, CPU or the like contained in the function expansion board or unit performs a part or entire process in accordance with designations of the program code and realizes functions of the above embodiments.

The present invention is not limited to the above embodiments and various changes and modifications can be made within the spirit and scope of the present invention. Therefore, to apprise the public of the scope of the scope of the present invention, the following claims are made. For example, the present invention can also be applied to a plate-shaped object which requires deformation or distortion.

What is claimed is:

1. A method of correcting a magnification of a mask pattern formed on a mask substrate, said method comprising the steps of:

applying forces to four pressurizing points of an outer periphery of an approximately ring-shaped frame, which supports the mask substrate and has a rectangular window, on substantially extended lines of two diagonal lines of the rectangular window; and adjusting at least an angle, to the extended lines, of a vector of the forces applied to each of the pressurizing points.

2. The method according to claim 1, wherein for at least some of the pressurizing points, pressurizing points are set for pressurizing in two directions perpendicular to each other, and for at least some of the vectors of the forces, the force is decomposed in X- and Y-axis directions parallel to sides of the rectangular window and applied to the frame.

3. The method according to claim 1, further comprising applying the force to the frame through a rolling contactable portion.

4. The method according to claim 1, wherein some of the pressurizing points are set as fixed points.

5. The method according to claim 4, further comprising providing a receiving mechanism that receives the fixed point, a respective receiving mechanism for at least some of the fixed points having a slide function.

6. A device manufacturing method comprising the steps of:

correcting a magnification of a mask pattern formed on a mask substrate by applying forces to four pressurizing points of an outer periphery of an approximately ring-shaped frame, which supports the mask substrate and has a rectangular window, on substantially extended lines of two diagonal lines of the rectangular window, and by adjusting at least an angle to the extended lines of a vector of the forces applied to each of the pressurizing points; and transferring the mask pattern onto a photosensitive substrate.

7. A mask pattern manufacturing method comprising the step of:

applying forces to four pressurizing points of an outer periphery of an approximately ring-shaped frame, which supports a mask substrate and has a rectangular window, on substantially extended lines of two diagonal lines of the rectangular window;

adjusting at least an angle, to the extended lines, of a vector of the forces applied to each of the pressurizing points; and drawing a pattern while keeping a membrane distorted by a predetermined force.

8. An exposure apparatus which transfers the mask pattern, which is manufactured by the method according to claim 7, onto a photosensitive substrate.

9. The apparatus according to claim 8, further comprising a display;

a network interface; and a computer which executes network software, wherein maintenance information of the exposure apparatus is exchanged through a computer network by data communication.

10. The apparatus according to claim 9, wherein the network software provides, on said display, a user interface connected to an external network outside a factory in which the exposure apparatus is installed to access a maintenance database provided by a vendor or user of the exposure apparatus and allows obtaining information from the database through the external network.

11. A semiconductor device manufacturing method using the exposure apparatus according to claim 8, said method comprising the steps of:

installing, in a semiconductor factory, manufacturing apparatuses for performing various processes; and manufacturing a semiconductor device using the manufacturing apparatuses by performing a plurality of processes.

12. The method according to claim 11, further comprising the steps of:

connecting the manufacturing apparatuses through a local area network; and exchanging information related to at least one of the manufacturing apparatuses between the local area network and an external network outside the semiconductor manufacturing factory by data communication.

13. The method according to claim 12, further comprising performing one of (i) obtaining maintenance information of the manufacturing apparatus by accessing, through an external network, a database provided by a vendor or user of the exposure apparatus by data communication, and (ii) production management by data communication with a semiconductor manufacturing factory different from the semiconductor manufacturing factory through the external network.

14. A maintenance method for the exposure apparatus according to claim 8, which is installed in a semiconductor manufacturing factory, said method comprising the steps of:

causing a vendor or user of the exposure apparatus to provide a maintenance database connected to an external network outside the semiconductor manufacturing factory;

permitting access from the semiconductor manufacturing factory to the maintenance database through the external network; and transmitting maintenance information accumulated in the database to the semiconductor manufacturing factory side through the external network.

15. An apparatus for correcting a magnification of a mask pattern formed on a mask substrate, said apparatus comprising:

a pressurizing mechanism which applies forces to four pressurizing portions of an outer periphery of an approximately ring-shaped frame, which supports the mask substrate and has a rectangular window, on substantially extended lines of two diagonal lines of the rectangular window, wherein at least an angle, to the extended lines, of a vector of the forces applied to each of the pressurizing portions by said pressurizing mechanism is adjustable.

16. The apparatus according to claim 15, wherein for at least some of the pressurizing portions, pressurizing portions are set for pressurizing in two directions perpendicular to each other, and for at least some of the vectors of the forces, the force is decomposed in X- and Y-axis directions parallel to sides of the rectangular window and applied to the frame.

17. The apparatus according to claim 15, wherein the force is applied to the frame through a rolling contactable portion.

18. The apparatus according to claim 15, wherein some of the pressurizing portions are fixed.

19. The apparatus according to claim 18, further comprising a receiving mechanism that receives the fixed portion, the receiving mechanism for at least some of the fixed portions having a slide function.

20. A semiconductor manufacturing factory comprising:

manufacturing apparatuses for performing various processes, including an exposure apparatus which transfers a mask pattern onto a photosensitive substrate using a mask pattern manufactured by applying forces to four pressurizing points of an outer periphery of an approximately ring-shaped frame, which supports a mask substrate and has a rectangular window, on substantially extended lines of two diagonal lines of the rectangular window, adjusting at least an angle, to the extended lines, of a vector of the forces applied to each of the pressurizing points, and drawing a pattern while keeping a membrane distorted by a predetermined force;

a local area network which connects the manufacturing apparatuses; and a gateway which allows the local area network to access an external network outside the factory, wherein information related to at least one of the manufacturing apparatuses is exchanged by data communication.

* * * * *

UNITED STATES PATENT AND TRADEMARK OFFICE
CERTIFICATE OF CORRECTION

PATENT NO. : 6,804,323 B2
DATED : October 12, 2004
INVENTOR(S) : Akira Moriya et al.

It is certified that error appears in the above-identified patent and that said Letters Patent is hereby corrected as shown below:

Column 6,
Line 53, "an" should read -- and a --.

Column 9,
Line 48, "detection-section" should read -- detection section --.

Column 11,
Line 57, "window 221." should read
-- window 221.
    Fig. 13 is a schematic view showing an apparatus which executes a mask pattern magnification correction method according to the sixth embodiment of the present invention. A support frame 231 of a mask structure has a rectangular outer periphery 234 parallel to a rectangular window 232 at the outer periphery of an upper portion 233. The corner portions of the rectangular outer periphery 234 are chamfered. A V-shaped groove 235 as a notch portion that defines the direction of the support frame 231 is formed in a lower portion 236. --

Column 12,
Lines 1-9, should be deleted in their entirety.
Line 47, "indicated" should read -- indicate --.

Column 13,
Lines 35 and 39, "(e.g." should read -- (e.g., --.

Column 16,
Line 15, after "computer.", insert the following paragraph:
-- Futhermore, besides the functions according to the above embodiments being realized by executing the read program by a computer, the present invention includes a case wherein an operating system (OS), or the like, working on the computer performs a part of or an entire actual processing in accordance with designations of the program code and realizes functions according to the above embodiments. --.

UNITED STATES PATENT AND TRADEMARK OFFICE
CERTIFICATE OF CORRECTION

PATENT NO. : 6,804,323 B2
DATED : October 12, 2004
INVENTOR(S) : Akira Moriya et al.

It is certified that error appears in the above-identified patent and that said Letters Patent is hereby corrected as shown below:

<u>Column 16, (cont'd,)</u>
Lines 25-33, should be deleted in their entirety.
Line 37, "public of the scope" should read -- public --.

Signed and Sealed this

Twelfth Day of April, 2005

JON W. DUDAS
*Director of the United States Patent and Trademark Office*